US011309220B2

(12) United States Patent
Park et al.

(10) Patent No.: US 11,309,220 B2
(45) Date of Patent: Apr. 19, 2022

(54) METHODS, APPARATUS, AND MANUFACTURING SYSTEM FOR SELF-ALIGNED PATTERNING OF A VERTICAL TRANSISTOR

(71) Applicant: GLOBALFOUNDRIES INC., Grand Cayman (KY)

(72) Inventors: Chanro Park, Clifton Park, NY (US); Ruilong Xie, Niskayuna, NY (US); Min Gyu Sung, Latham, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/676,005

(22) Filed: Aug. 14, 2017

(65) Prior Publication Data
US 2019/0051563 A1 Feb. 14, 2019

(51) Int. Cl.
*H01L 21/8234* (2006.01)
*H01L 29/66* (2006.01)
*H01L 29/78* (2006.01)

(52) U.S. Cl.
CPC ........ *H01L 21/823431* (2013.01); *H01L 29/66666* (2013.01); *H01L 29/66795* (2013.01); *H01L 29/7827* (2013.01); *H01L 29/7855* (2013.01)

(58) Field of Classification Search
None
See application file for complete search history.

(56) References Cited

U.S. PATENT DOCUMENTS

| 8,232,163 | B2 * | 7/2012 | Ervin | H01L 21/84 257/E27.016 |
|---|---|---|---|---|
| 8,692,307 | B2 * | 4/2014 | Ervin | H01L 21/84 257/301 |
| 8,836,003 | B2 * | 9/2014 | Ervin | H01L 21/84 257/301 |
| 9,412,822 | B2 * | 8/2016 | Cai | H01L 29/1054 |
| 9,478,634 | B2 * | 10/2016 | Xie | H01L 29/66545 |
| 9,711,618 | B1 * | 7/2017 | Cheng | H01L 29/66545 |
| 9,761,491 | B1 * | 9/2017 | Huang | H01L 21/76897 |
| 9,870,952 | B1 * | 1/2018 | Cheng | H01L 21/823487 |
| 9,960,271 | B1 * | 5/2018 | Xie | H01L 29/7827 |
| 2012/0104547 | A1 * | 5/2012 | Ervin | H01L 21/84 257/532 |
| 2012/0261797 | A1 * | 10/2012 | Ervin | H01L 21/84 257/532 |
| 2013/0181263 | A1 * | 7/2013 | Cai | H01L 29/66795 257/288 |
| 2014/0084418 | A1 * | 3/2014 | Ervin | H01L 21/84 257/532 |
| 2017/0179123 | A1 * | 6/2017 | Chang | H01L 27/0886 |
| 2017/0373162 | A1 * | 12/2017 | Cheng | H01L 29/41791 |
| 2017/0373167 | A1 * | 12/2017 | Bergendahl | H01L 29/785 |
| 2018/0240873 | A1 * | 8/2018 | Cheng | H01L 29/0847 |

* cited by examiner

*Primary Examiner* — Bo B Jang
(74) *Attorney, Agent, or Firm* — Williams Morgan, P.C.

(57) ABSTRACT

A method, apparatus, and manufacturing system are disclosed herein for a vertical field effect transistor patterned in a self-aligned process. A plurality of fins is formed. A gate structure is formed on at least a first side and a second side of a lower portion of each fin. A spacer is formed on at least a first side and a second side of an upper portion of each fin. At least one layer is formed above the substrate and between the fins. An opening is formed in the at least one layer between the fins by an etching process. The spacer protects the gate structure during the etching process.

13 Claims, 17 Drawing Sheets

METHODS, APPARATUS, AND MANUFACTURING SYSTEM FOR SELF-ALIGNED PATTERNING OF A VERTICAL TRANSISTOR

BACKGROUND OF THE INVENTION

Field of the Invention

Generally, the present disclosure relates to the manufacture of sophisticated semiconductor devices, and, more specifically, to various methods for reducing threshold voltage shifts in a vertical FET device.

Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein so-called metal oxide semiconductor field effect transistors (MOSFETs or FETs) represent one significant type of circuit element that substantially determines performance of the integrated circuits. A FET is a device that typically includes a source region, a drain region, a channel region that is positioned between the source region and the drain region, and a gate electrode positioned above the channel region. Current flow through the FET is controlled by a voltage applied to the gate electrode. If a voltage that is less than a threshold voltage of the device is applied to the gate electrode, then there is substantially no current flow through the device (ignoring undesirable leakage currents, which are relatively small). However, when a voltage that is equal to or greater than the threshold voltage of the device is applied to the gate electrode, the channel region becomes conductive, and electrical current is permitted to flow between the source region and the drain region through the conductive channel region.

In contrast to a planar FET, which has a flat structure, there are so-called 3D devices. More specifically, in such 3D devices, a generally vertically positioned, fin-shaped active area is formed and a gate electrode encloses both of the sides and the upper surface of the fin-shaped active area to produce a channel having a 3-dimensional structure instead of a planar structure. In some cases, an insulating cap layer, e.g., silicon nitride is positioned at the top of the fin-shaped active areas.

FET designs form these "fins" on the surface of a semiconductor wafer using selective-etching processes. The fins may be used to form a raised channel between the source and drain of a transistor. The gate is then deposited such that it wraps around the fin. This 3-dimensional channel is relatively thin, and thus, the gate generally has significant control over the carriers within. However, the shape of the channel may limit the current flow. Therefore, multiple fins may be used in parallel to provide greater current flow for increased drive strength.

To satisfy the ever-increasing desire for a smaller footprint for semiconductor devices, designers have turned to vertical FETs (vFETs). A vFET generally has a channel that is in a perpendicular configuration relative to the substrate surface. This is in contrast to conventional FETs that have channels that are configured along the plane of the substrate surface. The vertical configuration of vFETs allows for increased packing density since vFETs provide improved scaling limits as compared to conventional FETs.

FIGS. 1-2 illustrate stylized cross-sectional depictions of prior art vFET devices. FIG. 1 illustrates a vFET device 100 comprising a bottom S/D region 150 and a top S/D region 155, separated by fins 130 and gate material 140. The bottom S/D region 150 is formed on a substrate 110. As depicted, the vFET device 100 also comprises a bottom spacer 120 and a top spacer 125.

Although manufacture of the vFET device 100 is the objective of prior workers, FIG. 2 illustrates a problem repeatedly encountered in the art. In FIG. 2, prior art vFET device 200 is prepared by reactive ion etching (RIE) of amorphous carbon deposited on a patterned workpiece. However, as depicted in FIG. 2, in some manufacturing scenarios the critical dimension of an RIE patterning overlay is narrower than the width of fins 230A, 230B, and 230C, and the patterning shifted with respect to the fins 230A, 230B, and 230C As a result, work function metal (WFM) layer 265 is exposed to plasma during RIE. Plasma exposure can damage WFM layer 265, thereby leading to a threshold voltage ($V_T$) shift of a vFET comprising a fin 230A, 230B, or 230C. Also, a high-k dielectric layer 260 underlying the WFM layer 265 may be exposed to plasma during RIE and thereby damaged. Damage to high-k dielectric layer 260 will also impair the function of a vFET comprising fin 230C.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods, apparatus, and manufacturing systems for fabricating a vertical field effect transistor (FET) device. A first source/drain (S/D) region may be formed on a substrate. A plurality of fins is formed on the substrate (and the first S/D region, if present). A gate structure is formed on at least a first side and a second side of a lower portion of each fin. A spacer is formed on at least a first side and a second side of an upper portion of each fin. At least one layer is formed above the substrate and between the fins. An opening is formed in the at least one layer between the fins by an etching process. The spacer protects the gate structure from the etching process.

BRIEF DESCRIPTION OF THE DRAWINGS

The disclosure may be understood by reference to the following description taken in conjunction with the accompanying drawings, in which like reference numerals identify like elements, and in which.

Figure 1:
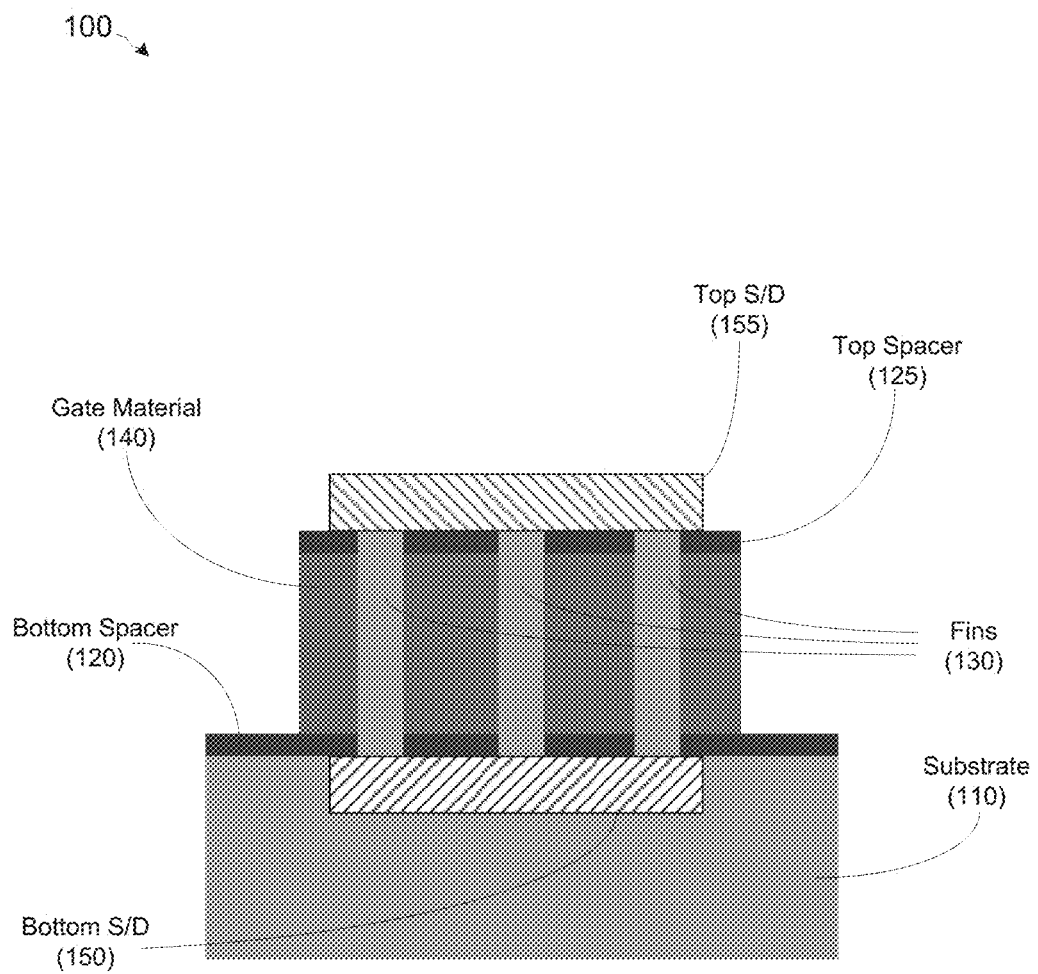
FIG. 1 illustrates a stylized cross-sectional depiction of a typical vFET device.
Figure 2:
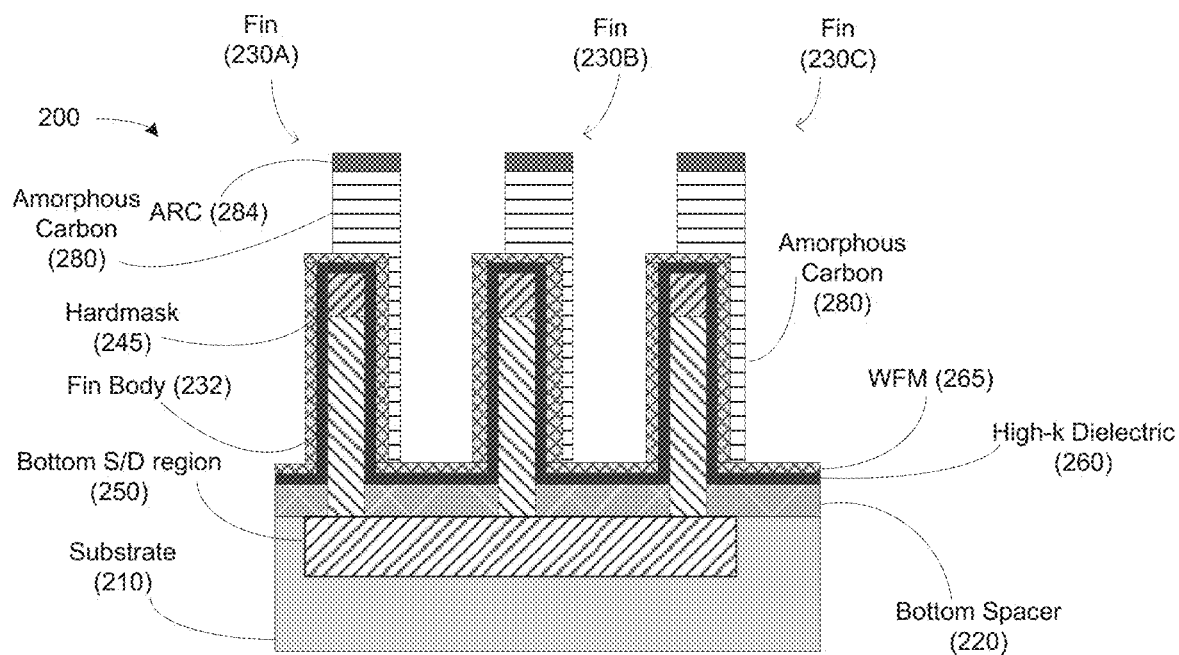
FIG. 2 illustrates a stylized cross-sectional view of a prior art vFET (device 300) under manufacture.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims. Moreover, the stylized depictions illustrated in the drawings are not drawn to any absolute scale. Further, the only relative scales illustrated in the drawings relate to relations between the first height and the second height, and the first width and the second width, as described in the text.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Embodiments herein provide for forming FET devices (e.g., vFET devices) with reduced damage to a WFM layer of the vFET devices. Embodiments herein provide for a vFET that comprises a plurality of fins comprising a work function metal (WFM) up to a first height on the sides of the fins and a nitride spacer at a second, greater height on the sides of the fins; a bottom source/drain (S/D) region below the fins; and a second S/D region above the fins. The described structure, owing at least in part to the relation between the fin width at the first and second heights, provides a method to pattern vFET in a self-aligned way with reduced damage to a WFM layer during a pattering process.

Figure 3:
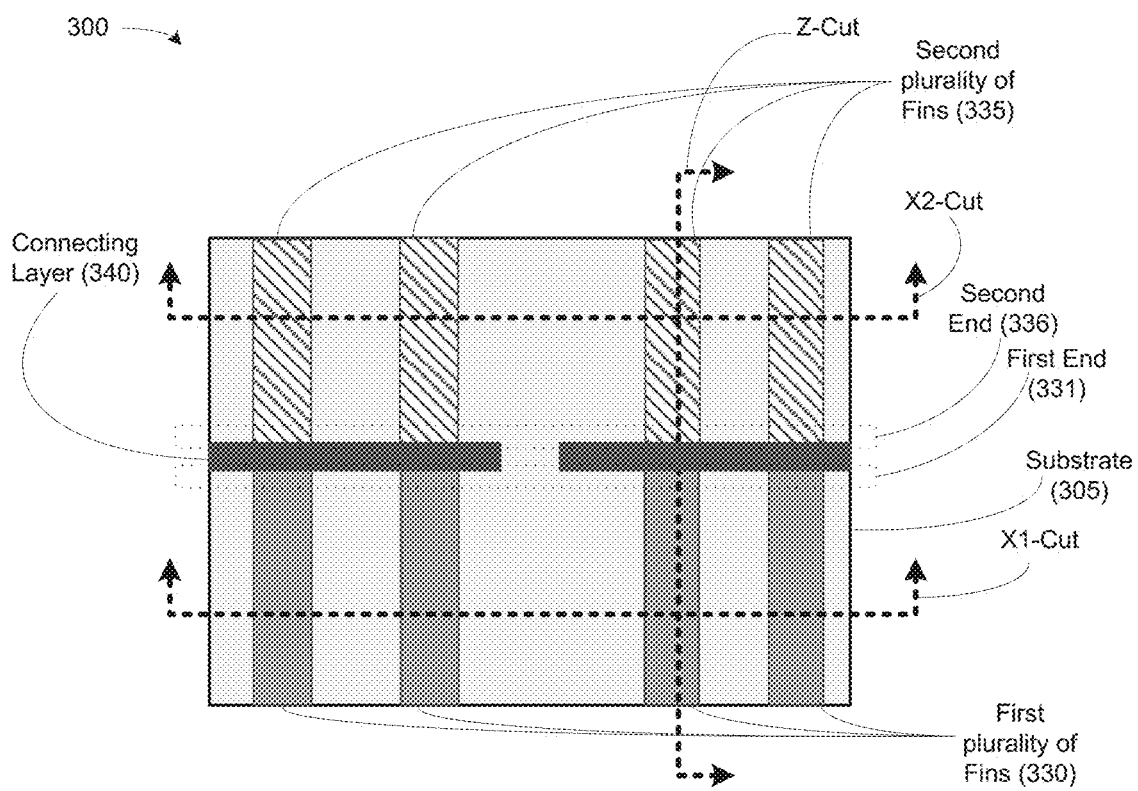
FIG. 3 illustrates a stylized plan depiction of a vFET device with X1-cut, X2-cut, and Z-cut lines of view indicated, in accordance with embodiments herein.

FIG. 3 illustrates a stylized plan depiction of a vFET device in accordance with embodiments herein. A connecting layer 340 is disposed over the first end 331 of a first plurality of fins 330 and over the second end 336 of a second plurality of fins 335. The first end 331 and the second end 336 are proximate each other but are not in direct contact with each other. In one embodiment, the first plurality of fins 330 are PFET components and the second plurality of fins 335 are NFET components. In another embodiment, the first plurality of fins 330 are NFET components and the second plurality of fins 335 are PFET components.

Subsequent stylized cross-sectional depictions of the vFET device according to embodiments herein will be taken along one of three cuts, an X1-cut (through and perpendicular to the long axes of the first plurality of fins 330), a X2-cut (through and perpendicular to the long axes of the second plurality of fins 335), and a Z-cut (parallel to the long axes of both pluralities of fins 330, 335, and through one fin of the first plurality of fins 330, one fin of the second plurality of fins 335, and connecting layer 340 or precursor structures thereto).

Figure 4:
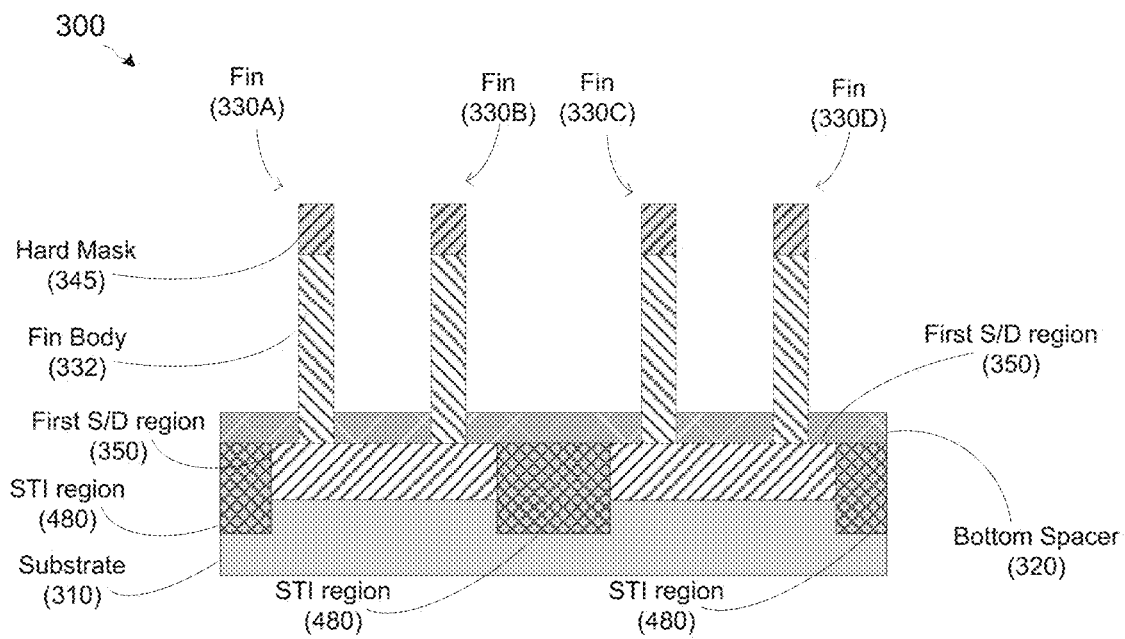
FIG. 4 illustrates a stylized X1-cut cross-sectional depiction of the vFET device under manufacture with respect to fin, shallow trench isolation, first source/drain region, and bottom spacer formation processes, in accordance with embodiments herein.

FIGS. 4-25 illustrate stylized cross-sectional depictions of a vFET device under various stage of manufacture, in accordance with embodiments herein. FIG. 4 illustrates a stylized X1-cut cross-sectional view of a vFET (device 300) under manufacture, in accordance with embodiments herein. In some embodiments, initial FET processing steps known to those skilled in the art having benefit of the present disclosure may be performed to provide a FET device 300 under manufacture that comprises a first plurality of fins 330 comprising fins 330A, 330B, 330C, 330D. The device 300 comprises a substrate 310 (e.g., silicon substrate, silicon germanium substrate, etc.). Using one of various techniques known to those skilled in the art, a plurality of fins 330A, 330B, 330C, 330D are formed on the substrate 310. The fins 330A, 330B, 330C, and 330D each comprise a fin body 332. In one embodiment, hardmask 345 of the first plurality of fins 330 may remain on top of the first plurality of fins 330 after the formation thereof. Further, in many embodiments, various features are formed on and/or in the substrate 310, such as a bottom or first S/D region 350, one or more STI regions 480, and/or a bottom spacer 320, among others which will be apparent to a person of ordinary skill in the art having the benefit of the present disclosure. Techniques for forming the various features depicted in FIG. 4 will be known to a person of ordinary skill in the art having benefit of the present disclosure, and need not be described further.

Figure 5:
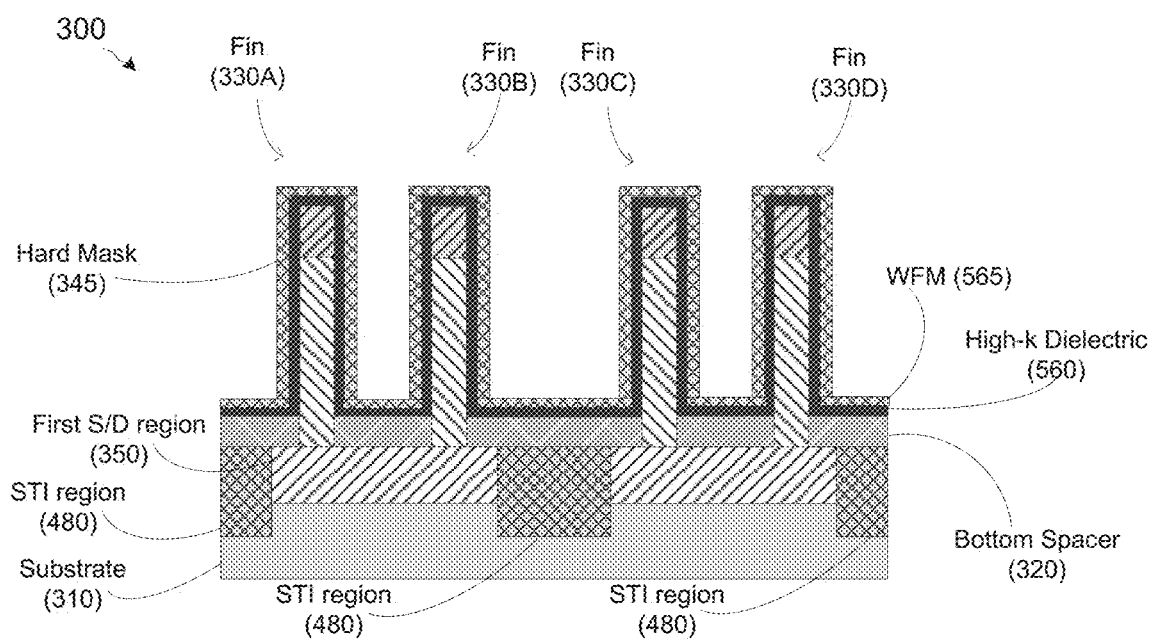
FIG. 5 illustrates a stylized X1-cut cross-sectional depiction of the vFET device under manufacture with respect to high-k dielectric layer and work function metal (WFM) layer formation processes, in accordance with embodiments herein.

Turning now to FIG. 5, a stylized X1-cut cross-sectional depiction of the vFET device under manufacture with respect to high-k dielectric layer and WFM layer formation processes on the first plurality of fins 330 is illustrated, in accordance with embodiments herein. A high-k dielectric layer formation process is performed. This process comprises forming a high-k dielectric layer 560 over the first plurality of fins 330 and bottom spacer 320. A person of ordinary skill in the art may form the high-k dielectric layer 560 as a routine matter.

Also, a WFM layer formation process is performed. This process comprises forming a WFM layer 565 over the high-k dielectric layer 560. A person of ordinary skill in the art may form the WFM layer 565 as a routine matter, bearing in mind whether the first plurality of fins 330 will be components of a PFET or an NFET will be a significant factor in determining which work function metal may be selected for WFM layer 565. The high-k dielectric layer 560 and the WFM layer 565 deposited above the first plurality of fins 330 are thin enough to leave spaces between fins, as shown in FIG. 5.

Figure 6:
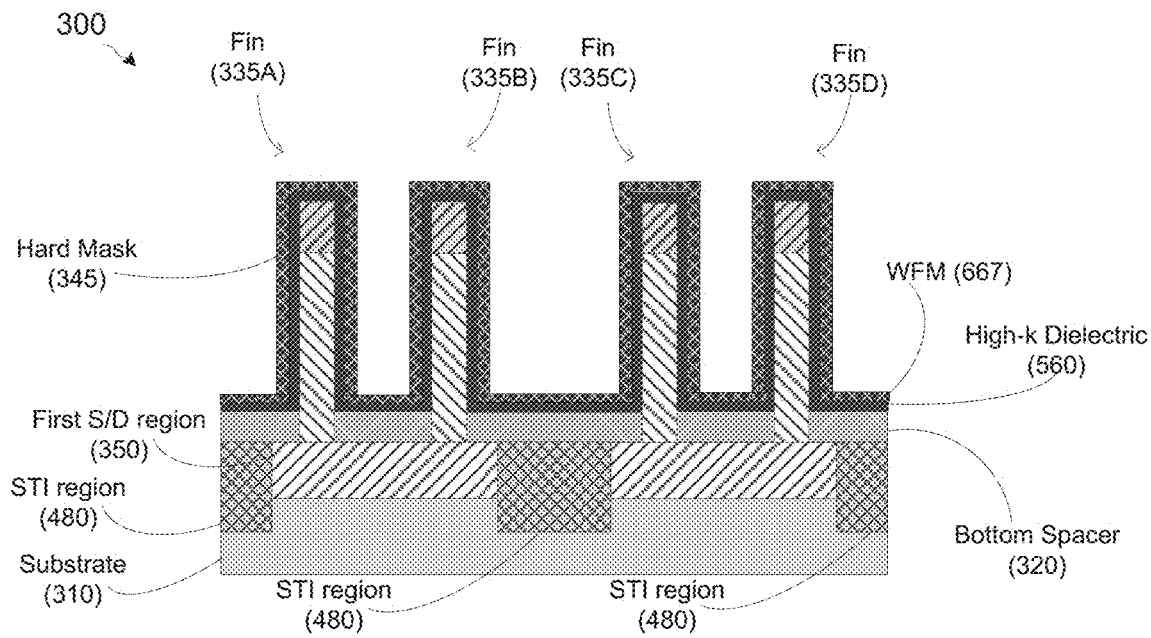
FIG. 6 illustrates a stylized X2-cut cross-sectional depiction of the vFET device under manufacture with respect to high-k dielectric layer and WFM layer formation processes, in accordance with embodiments herein.

FIG. 6 illustrates a stylized X2-cut cross-sectional depiction of the vFET device under manufacture with respect to high-k dielectric layer and WFM layer formation processes on the second plurality of fins 335, in accordance with embodiments herein. The high-k dielectric layer 560 may be formed as described above with reference to FIG. 5. The WFM layer 667 may be formed as described above with reference to FIG. 5, bearing in mind whether the second plurality of fins 335 will be components of a PFET or an NFET will be a significant factor in determining which work function metal may be selected for WFM layer 667. Generally, WFM layer 565 and WFM layer 667 comprise different work function metals.

Hereinafter, the first plurality of fins 330 and the second plurality of fins 335 will undergo generally identical processes. In the interest of brevity, only the first plurality of fins 330 of the vFET device under manufacture will be depicted. Processes performed on WFM layer 565 will be understood to also be performed on WFM layer 667.

Figure 7:
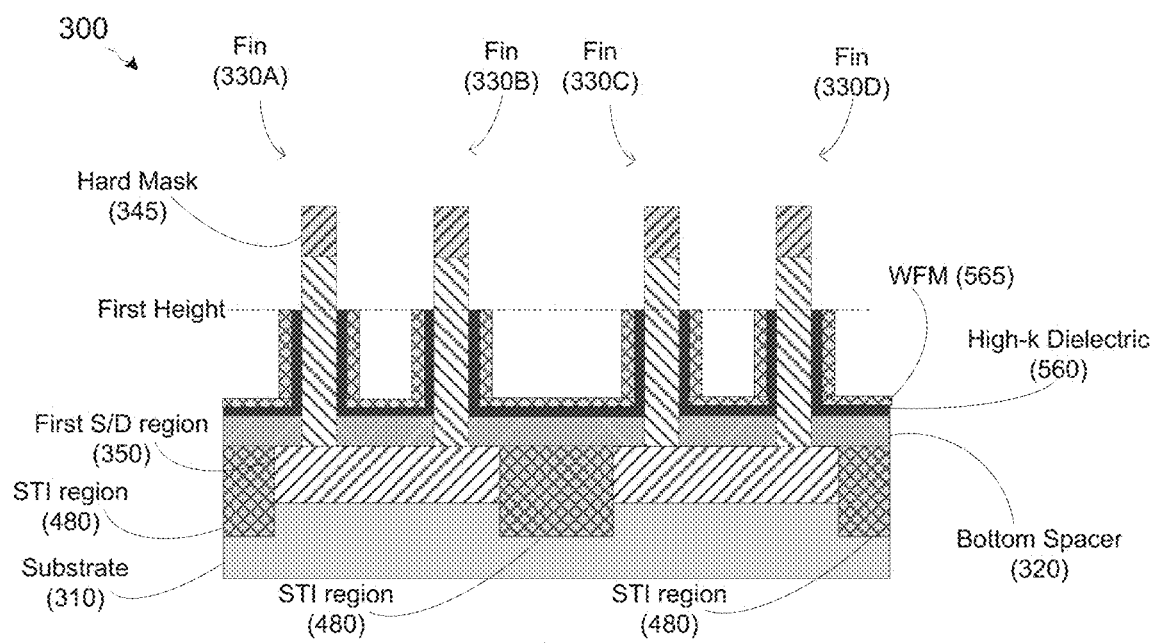
FIG. 7 illustrates a stylized X1-cut cross-sectional depiction of the vFET device under manufacture with respect to an opening formation process, in accordance with embodiments herein.

FIG. 7 illustrates a stylized X1-cut cross-sectional depiction of the vFET device under manufacture with respect to an opening formation process, in accordance with embodiments herein. The high-k dielectric layer 560 and the WFM layer 565 are removed from the tops of the first plurality of fins 330 and from portions of the sides of the first plurality of fins 330 above a first height. Removal of the high-k dielectric layer 560 and the WFM layer 565 above the first height may be performed by any appropriate technique. For example, removal of the high-k dielectric layer 560 and the WFM layer 565 above the first height may comprise depositing a sacrificial layer over the plurality of fins, performing CMP, and etching the sacrificial layer using process parameters which will also remove the portions of the high-k dielectric layer 560 and the WFM layer 565 above the first height.

Figure 8:
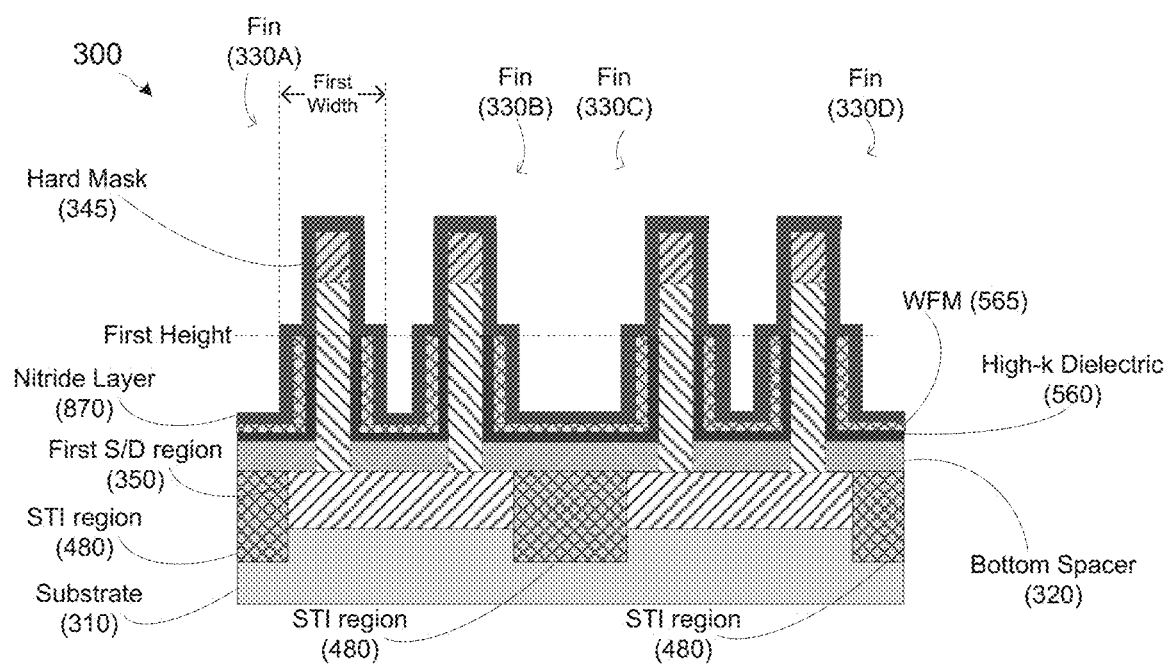
FIG. 8 illustrates a stylized X1-cut cross-sectional depiction of the vFET device under manufacture with respect to a nitride deposition process, in accordance with embodiments herein.

FIG. 8 illustrates a stylized X1-cut cross-sectional depiction of the vFET device under manufacture with respect to a nitride deposition process, in accordance with embodiments herein. A nitride layer 870 may be deposited over the first plurality of fins 330 using any appropriate technique. In one embodiment, the nitride layer 870 may comprise silicon nitride.

The processes illustrated in FIGS. 4-5 and 7-8 result in fin structures 330A-D that each comprises a fin body 332, an hardmask 345 on the top, and a high-k dielectric layer 560, a WFM layer 565, and a nitride layer 870 on the sidewalls of each fin structure 330A-D. Each fin, e.g., fin 330A, has a first width at the first height. The first width encompasses the width of the fin body 332 plus the width of the high-k dielectric layer 560, the WFM layer 565, and the nitride layer 870 on each side of the fin.

Figure 9:
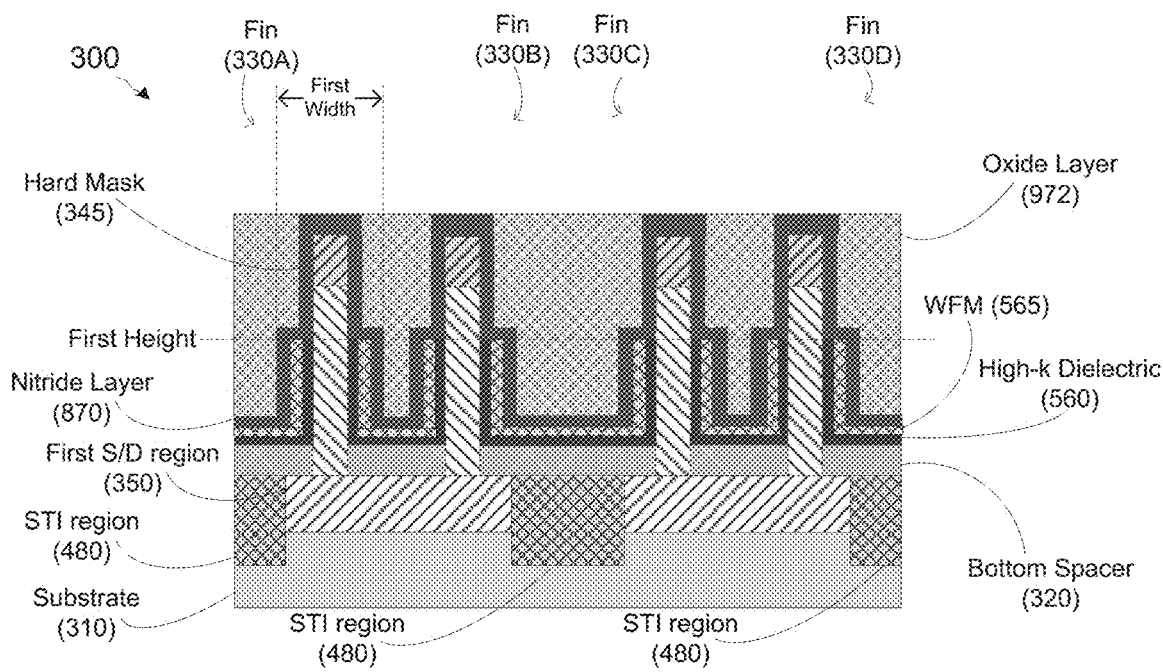
FIG. 9 illustrates a stylized X1-cut cross-sectional depiction of the vFET device under manufacture with respect to oxide deposition and chemical-mechanical polishing (CMP) processes, in accordance with embodiments herein.

FIG. 9 illustrates a stylized X1-cut cross-sectional depiction of the vFET device under manufacture with respect to oxide deposition and CMP processes, in accordance with embodiments herein. An oxide layer 972 may be deposited over the first plurality of fins 330 using any appropriate technique. In one embodiment, the oxide layer 972 comprises silicon oxide. The oxide layer 972 may be deposited to a level over the tops of the fins 330 (not shown), and subsequently undergo a CMP process in order to lower the top of the oxide layer 972 to be substantially co-planar with the tops of the first plurality of fins 330.

Figure 10:
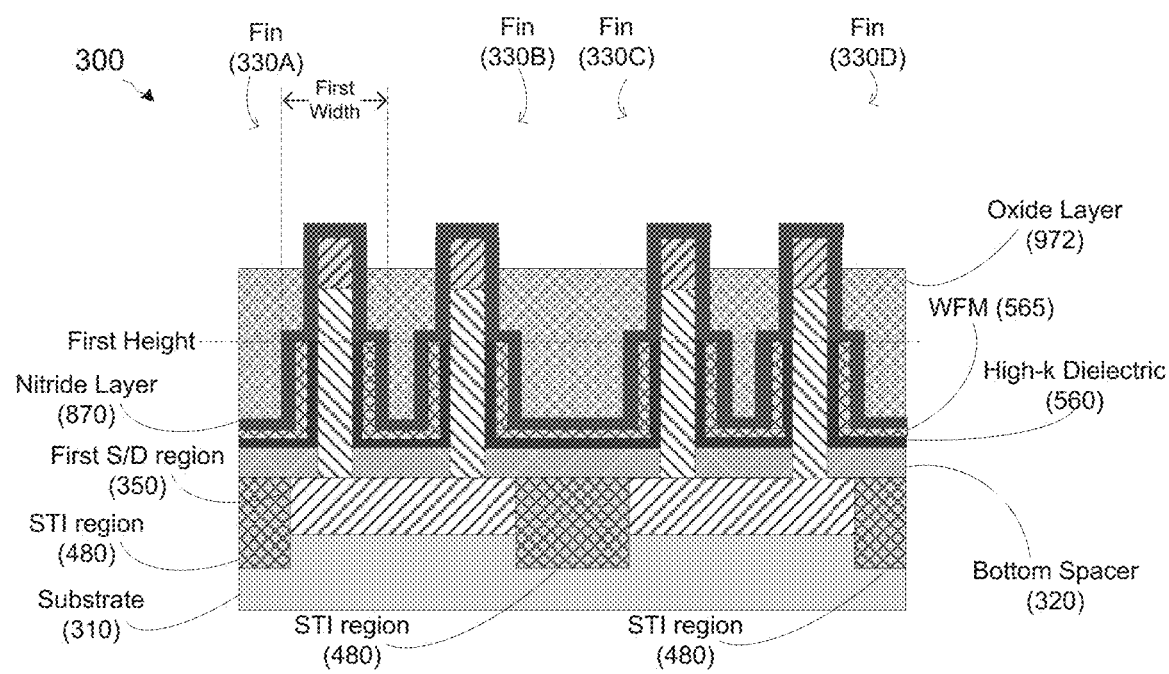
FIG. 10 illustrates a stylized X1-cut cross-sectional depiction of the vFET device under manufacture with respect to an oxide recess process, in accordance with embodiments herein.

FIG. 10 illustrates a stylized X1-cut cross-sectional depiction of the vFET device under manufacture with respect to an oxide recess process, in accordance with embodiments herein. An oxide layer 972 may be recessed using any appropriate technique. The oxide layer 972 may be recessed such that the top of the oxide layer 972 is below the tops of the first plurality of fins 330 and yet above the first height.

Those skilled in the art would appreciate that processes either presently known or yet to be developed may permit the deposition of the oxide layer 972 such that the top of the oxide layer 972 is below the tops of the first plurality of fins 330 and above the first height. Using such processes, CMP and recess of the oxide layer 972 to yield a vFET device as depicted in FIG. 10 may not be required.

Figure 11:
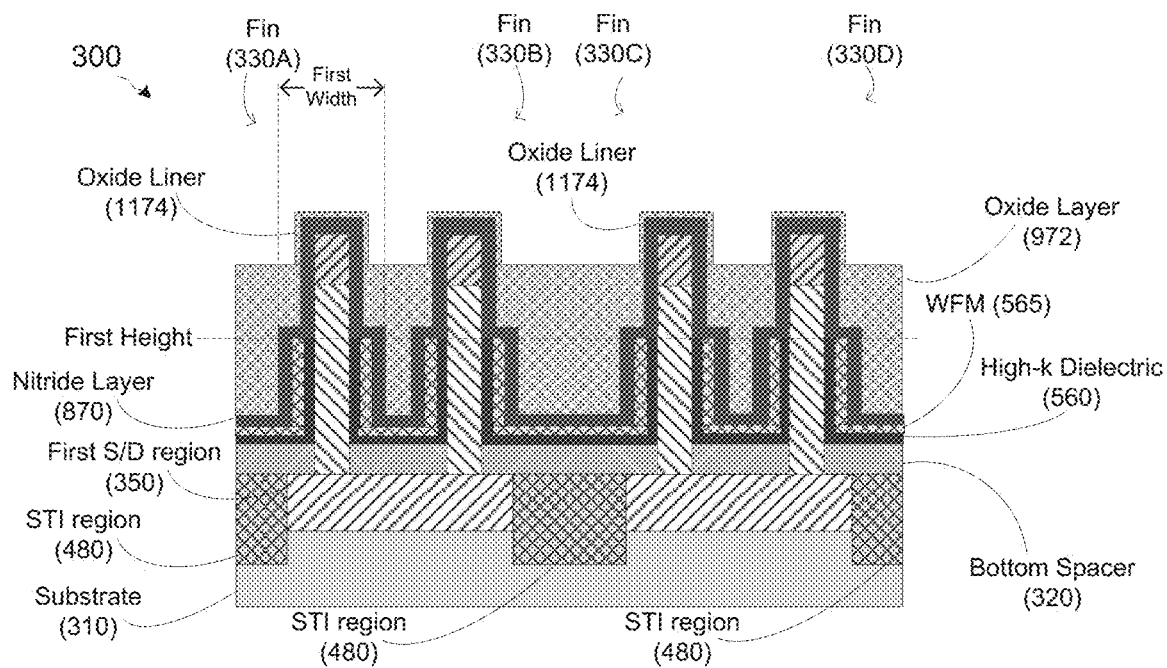
FIG. 11 illustrates a stylized X1-cut cross-sectional depiction of the vFET device under manufacture with respect to an oxide liner deposition process, in accordance with embodiments herein.

FIG. 11 illustrates a stylized X1-cut cross-sectional depiction of the vFET device under manufacture with respect to an oxide liner deposition process, in accordance with embodiments herein. An oxide liner 1174 may be deposited over portions of nitride layer 870 that are exposed above the top of oxide layer 972. (Any portion of the oxide liner 1174 deposited on oxide layer 972 will be hereinafter considered as being part of oxide layer 972 and will not be considered separately). In one embodiment, the oxide liner 1174 may comprise silicon oxide. Though not to be bound by theory, the oxide liner 1174 may protect underlying portions of nitride layer 870 in subsequent operations.

Figure 12:
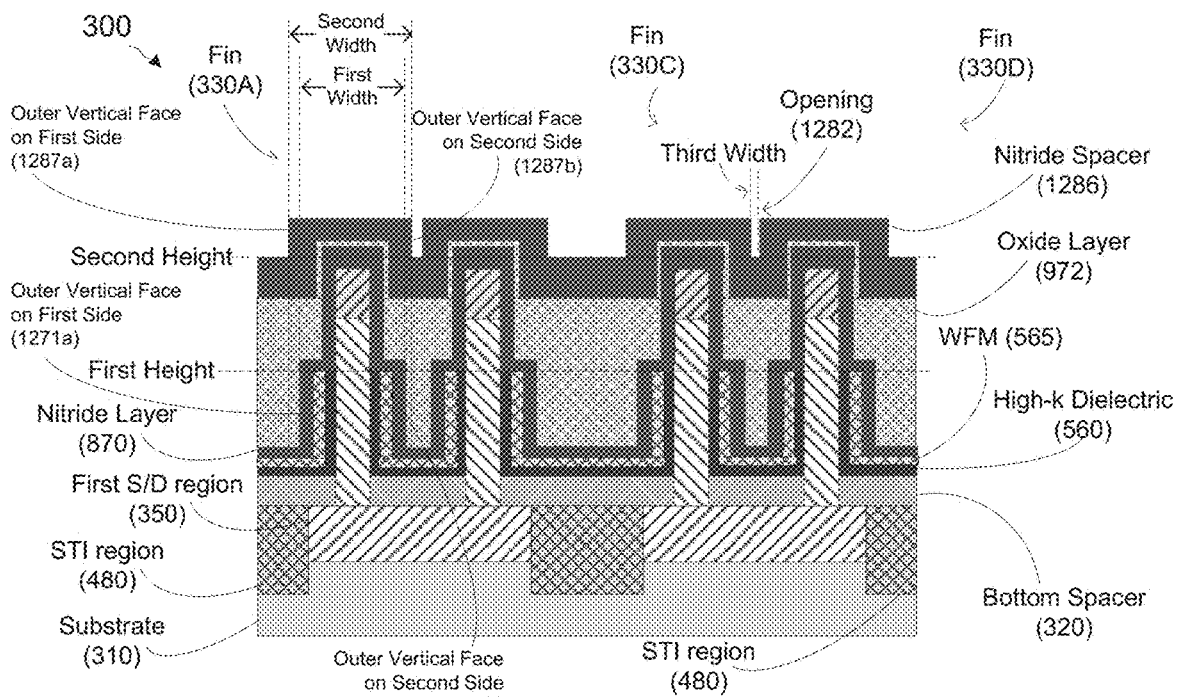
FIG. 12 illustrates a stylized X1-cut cross-sectional depiction of the vFET device under manufacture with respect to a nitride spacer deposition process, in accordance with embodiments herein.

FIG. 12 illustrates a stylized X1-cut cross-sectional depiction of the vFET device under manufacture with respect to a nitride spacer deposition process, in accordance with embodiments herein. A nitride spacer 1286 is deposited over each member of the first plurality of fins 330, and over oxide layer 972 between the fins 330. The nitride spacer 1286 may be deposited by any appropriate technique. In one embodiment, the nitride spacer 1286 may comprise silicon nitride. The nitride spacer 1286 is deposited to a thickness such that at a second height on the fins 330, the second height is the height of the nitride spacer 1286 disposed between fins 330, each fin 330 (e.g., fin 330A), and has a second width, which is greater than the first width. The second width encompasses the thickness of fin body 332 and/or one or more of hardmask 345, nitride layer 870, oxide liner 1174, and/or nitride spacer 1286 disposed on top of fin body 332, and nitride layer 870, oxide liner 1174, and nitride spacer 1286 disposed on sidewalls of the fin. In other words, the first width is the lateral distance from an outer vertical face 1271a of nitride layer 870 on a first side of the fin 330A to an outer vertical face 1271b of nitride layer 870 on a second side of the fin 330A at the first height; and the second width is the lateral distance from an outer vertical face 1287a of nitride spacer 1286 on a first side of the fin 330A to an outer vertical face 1287b of the nitride spacer 1286 on a second side of the fin 330A at the second height.

Also as shown in FIG. 12, the space between the nitride spacer 1286 disposed on the sidewalls of adjacent fins 330, e.g., fins 330C and 330D, may be considered an opening 1282. The opening 1282 has a third width at the second height. The opening 1282 will be discussed in more detail below.

In the manufacture of a vFET structure comprising multiple pluralities of fins, it may not be necessary to form a nitride spacer and/or other processes as shown in FIG. 12 and/or later figures. Accordingly, in embodiments herein, prior to forming a nitride spacer 1286 as shown in FIG. 12, other pluralities of fins (not shown) for which nitride spacer formation may not be desired may be masked. A person of ordinary skill in the art may mask such other pluralities of fins using known techniques in the art.

Figure 13:
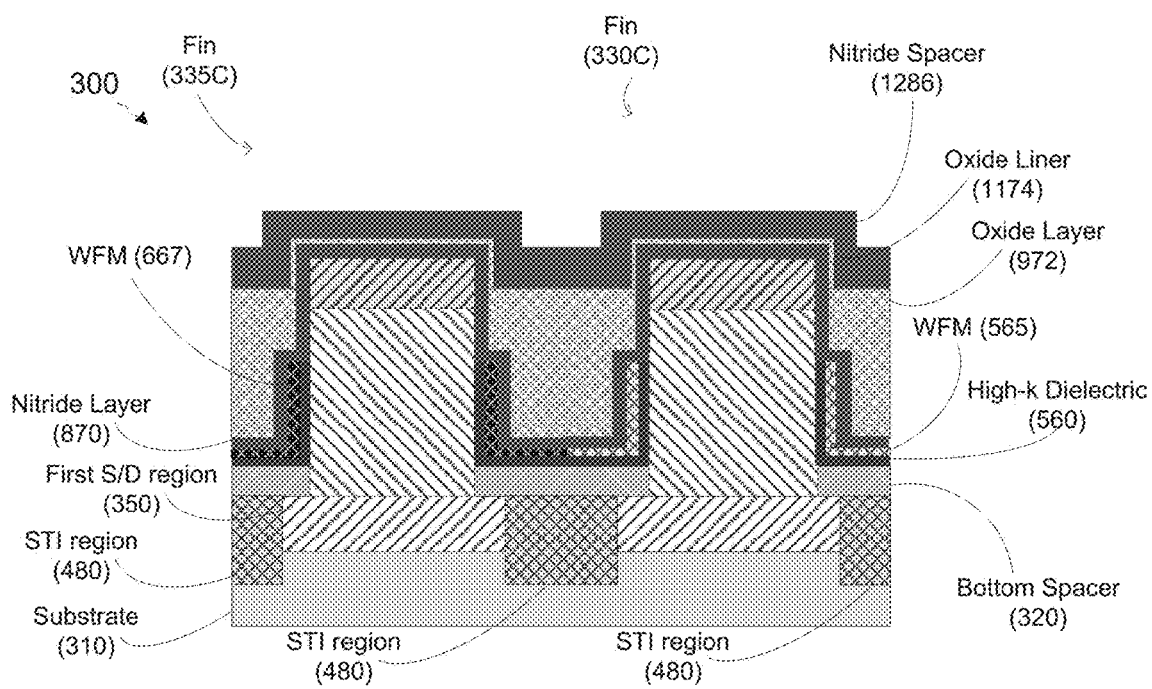
FIG. 13 illustrates a stylized Z-cut cross-sectional depiction of the vFET device under manufacture with respect to the nitride spacer deposition process, in accordance with embodiments herein.

FIG. 13 illustrates a stylized Z-cut cross-sectional depiction of the vFET device under manufacture with respect to the nitride spacer deposition process, in accordance with embodiments herein. The nitride spacer 1286 is deposited over both the first plurality of fins 330 and the second plurality of fins 335. The nitride spacer 1286 is also deposited over oxide layer 972 between fins.

Figure 14:
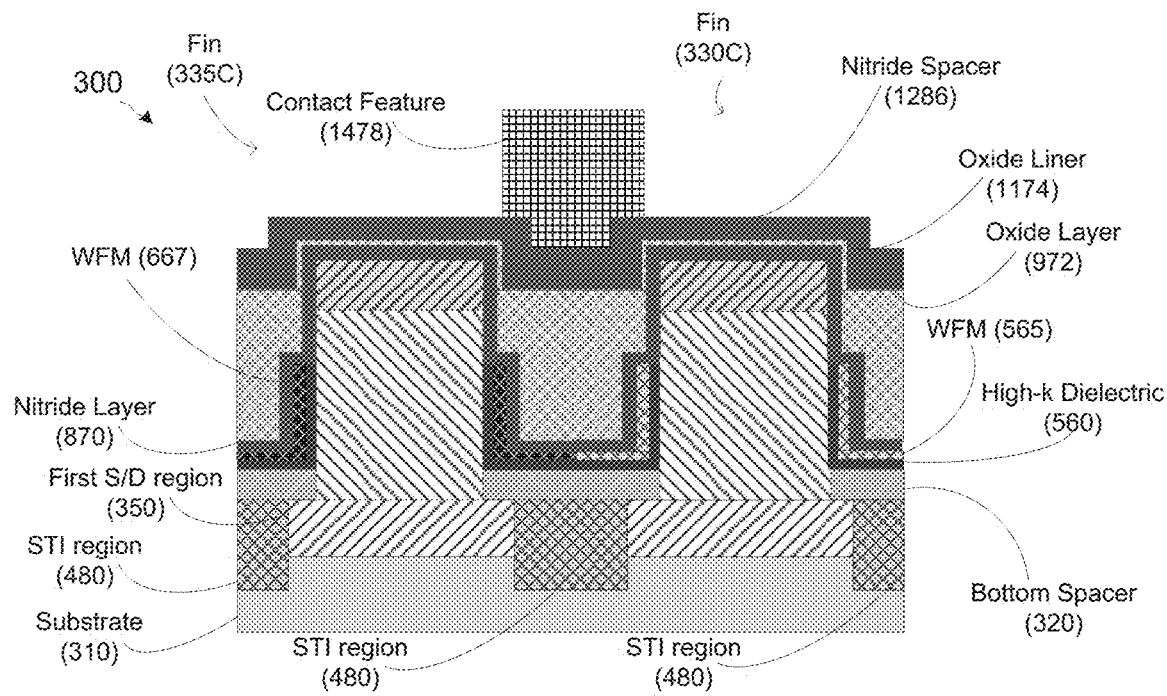
FIG. 14 illustrates a stylized Z-cut cross-sectional depiction of the vFET device under manufacture with respect to a lithography patterning process, in accordance with embodiments herein.

FIG. 14 illustrates a stylized Z-cut cross-sectional depiction of the vFET device under manufacture with respect to a lithography patterning process, in accordance with embodiments herein. A contact feature 1478 is patterned such that landing pads in electrical contact with both WFM layer 565 of the first plurality of fins 330 and the WFM layer 667 of the second plurality of fins 335 may be manufactured in later operations. Lithography patterning techniques for forming the contact features 1478 will be known to a person of ordinary skill in the art and need not be described further.

Figure 15:
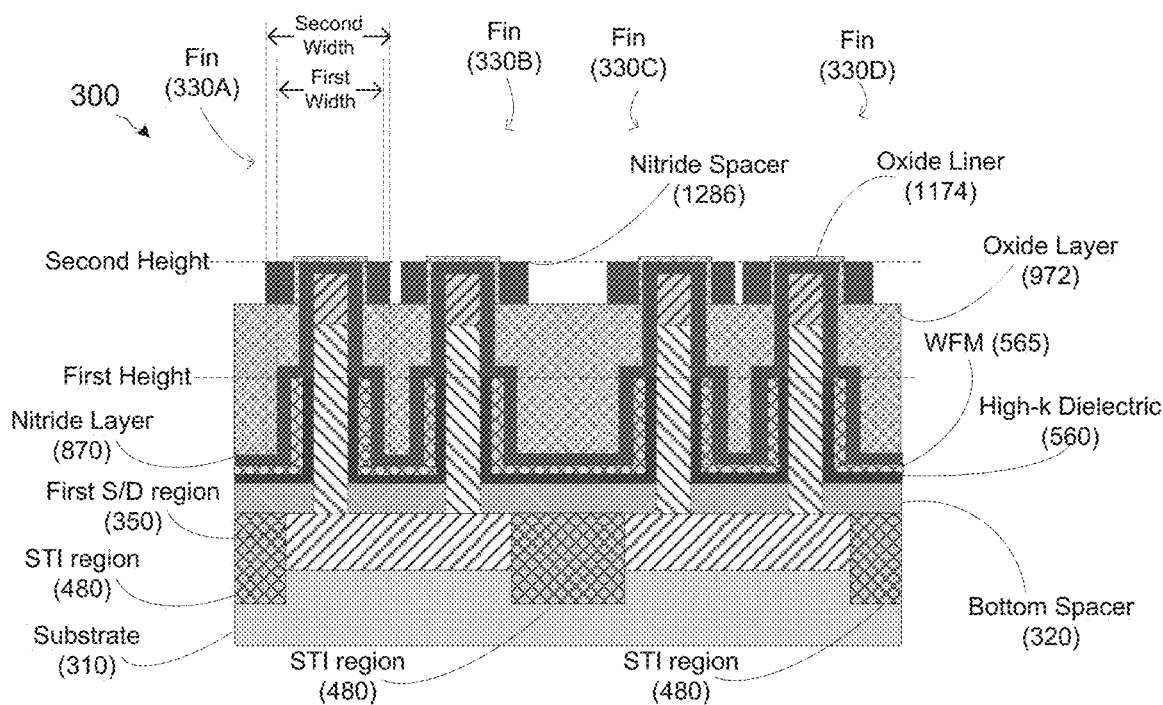
FIG. 15 illustrates a stylized X1-cut cross-sectional depiction of the vFET device under manufacture with respect to a nitride spacer removal process, in accordance with embodiments herein.
Figure 16:
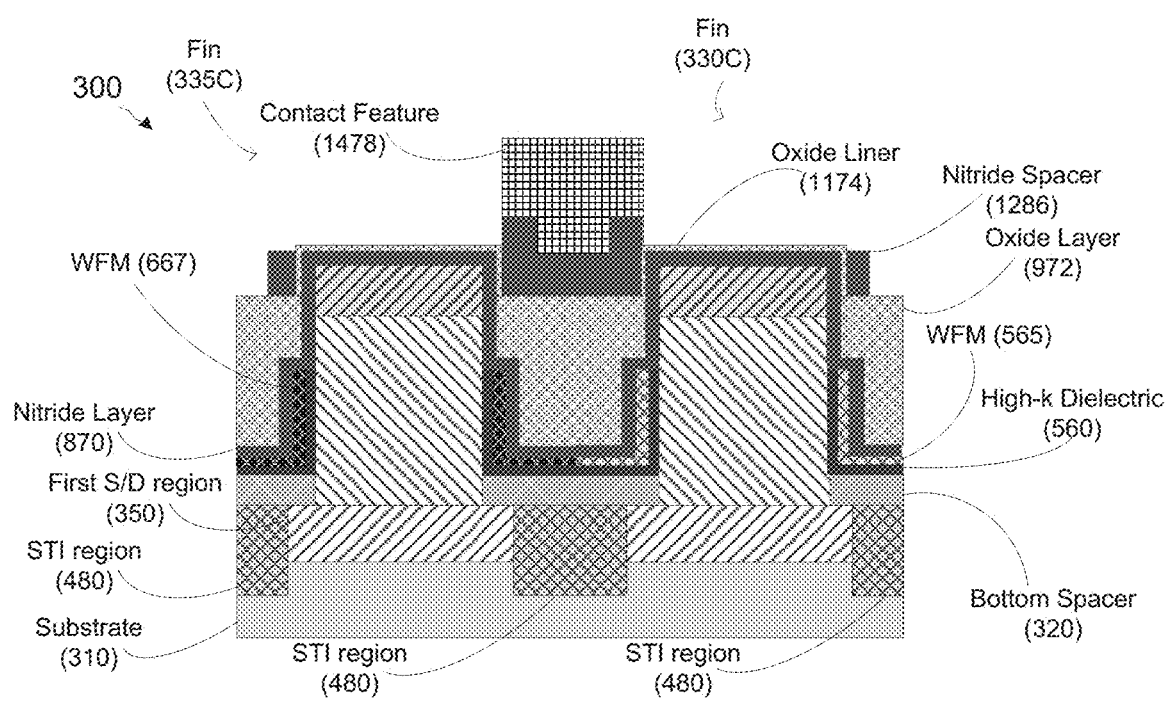
FIG. 16 illustrates a stylized Z-cut cross-sectional depiction of the vFET device under manufacture with respect to the nitride spacer removal process, in accordance with an embodiments herein.

FIG. 15 illustrates a stylized X1-cut cross-sectional depiction of the vFET device under manufacture with respect to a nitride spacer removal process, in accordance with embodiments herein. FIG. 16 illustrates a stylized Z-cut cross-sectional depiction of the vFET device under manufacture with respect to the nitride spacer removal process, in accordance with embodiments herein. The nitride spacer 1286 is partially removed, e.g., from over the oxide liner 1174 on top of the fins 330 and from over the oxide layer 972 between the fins 330. The nitride spacer 1286 is retained on the sidewalls of the fins 330 at least at the second height (and higher and/or lower, as may be desired). The nitride spacer 1286 may be removed by any appropriate technique, e.g., by etching selective to the oxide liner 1174 and the oxide layer 972.

Figure 17:
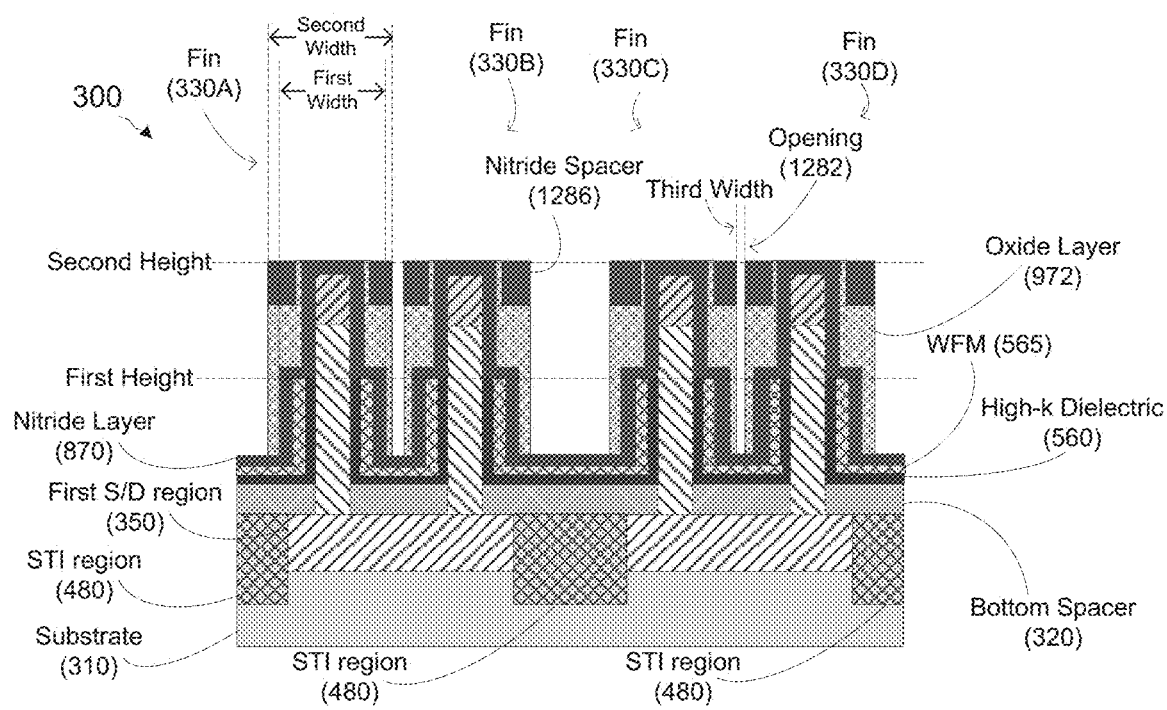
FIG. 17 illustrates a stylized X1-cut cross-sectional depiction of the vFET device under manufacture with respect to an opening formation process, in accordance with embodiments herein.

FIG. 17 illustrates a stylized X1-cut cross-sectional depiction of the vFET device under manufacture with respect to an opening formation process, in accordance with an alternative embodiment. As shown in FIG. 17, the opening 1282 is extended by partially removing the oxide layer 972. The oxide layer 972 is partially removed between the fins 330 using nitride spacer 1286 as a mask. The oxide layer 972 not covered by nitride spacer 1286 may be removed and the opening 1282 formed by any appropriate technique, such as RIE. Because the portions of the fins 330 that are covered by the nitride spacer 1286 have a second width greater than the first width, the nitride spacer 1286 provides protection to WFM layers 565 and 667 and high-k dielectric 560 during formation of the opening 1282. In other words, the WFM layer 565 on the first side and the second side of the fin 330A is not exposed to the opening 1282.

Figure 18:
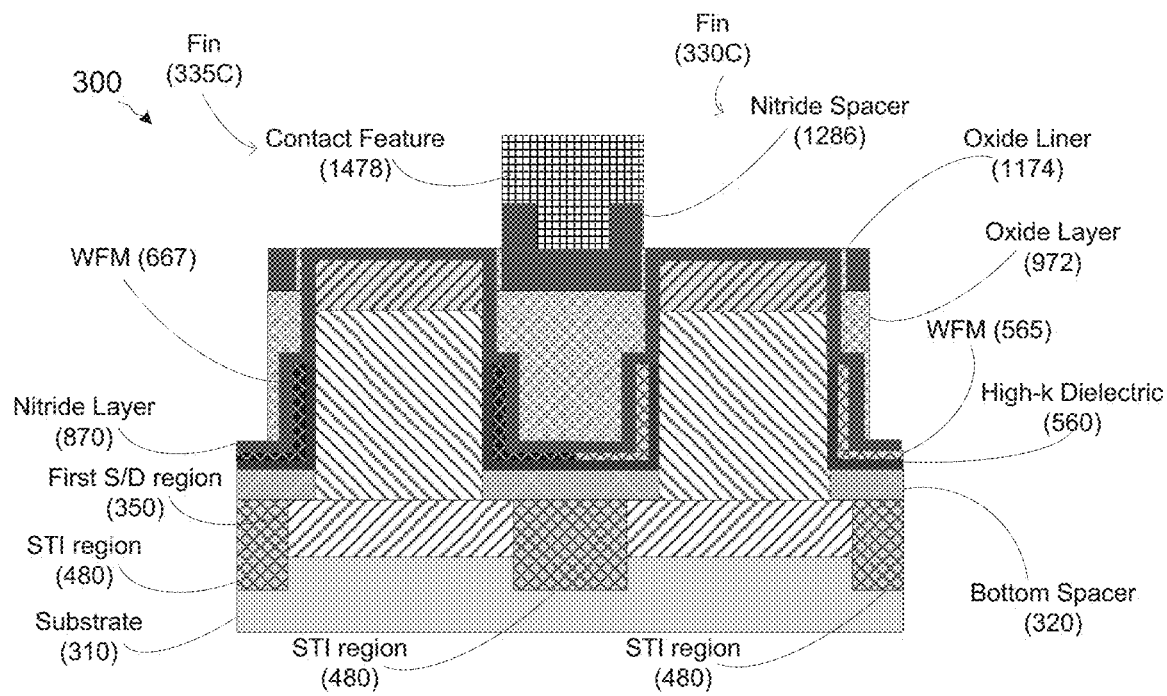
FIG. 18 illustrates a stylized Z-cut cross-sectional depiction of the vFET device under manufacture with respect to the oxide layer removal process, in accordance with embodiments herein.

Desirably, the opening 1282 is extended downward through the oxide layer 972 with minimal widening. Because the second width of each fin 330, i.e., the width encompassing the nitride spacer 1286 at the second height, is greater than the first width of each fin 330, i.e., the width encompassing the WFM layer 565, downward extension with minimal widening of the opening 1282 reduces the likelihood of exposure of the WFM layer 565 to plasma used in the RIE process forming the opening 1282. Accordingly, a vFET comprising the WFM layer 565 has a reduced threshold voltage shift. In other words, the opening 1282 is formed in a self-aligned process. FIG. 18 illustrates a stylized Z-cut cross-sectional depiction of the vFET device under manufacture with respect to the opening formation process, in accordance with embodiments herein. FIG. 18 shows the removal of the oxide liner 1174 above the fins 335C.

Figure 19:
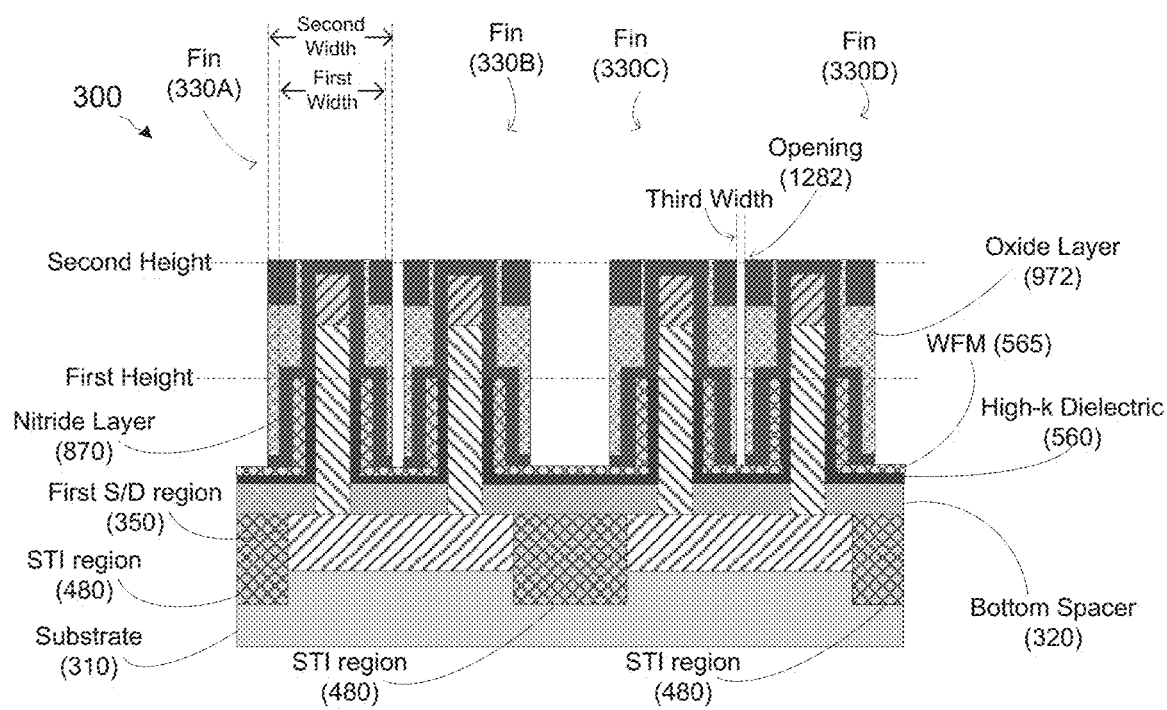
FIG. 19 illustrates a stylized X1-cut cross-sectional depiction of the vFET device under manufacture with respect to a nitride layer removal process, in accordance with embodiments herein.
Figure 20:
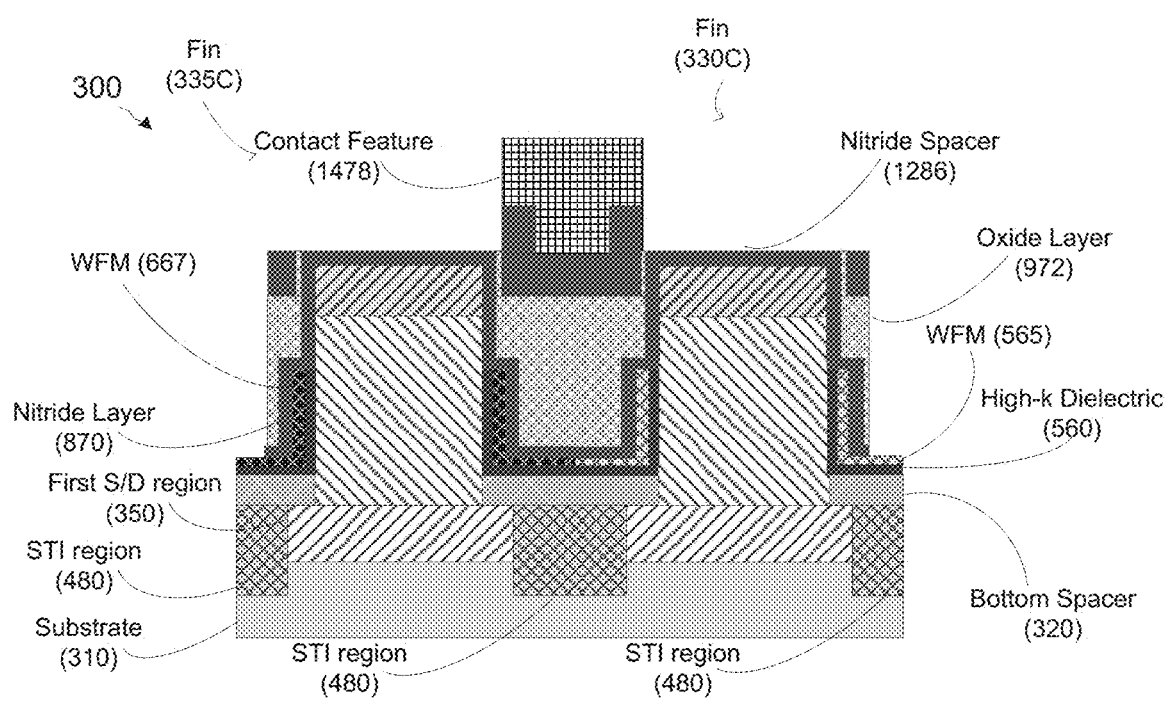
FIG. 20 illustrates a stylized Z-cut cross-sectional depiction of the vFET device under manufacture with respect to the nitride layer removal process, in accordance with embodiments herein.

FIG. 19 illustrates a stylized X1-cut cross-sectional depiction of the vFET device under manufacture with respect to a nitride layer removal process, in accordance with embodiments herein. FIG. 20 illustrates a stylized Z-cut cross-sectional depiction of the vFET device under manufacture with respect to the nitride layer removal process, in accordance with embodiments herein. The exposed portion of nitride layer 870 at the bottom of the opening 1282 is removed. The portion of nitride layer 870 may be removed by any appropriate technique. Other portions of nitride layer 870 disposed directly under oxide layer 972 are retained.

Figure 21:
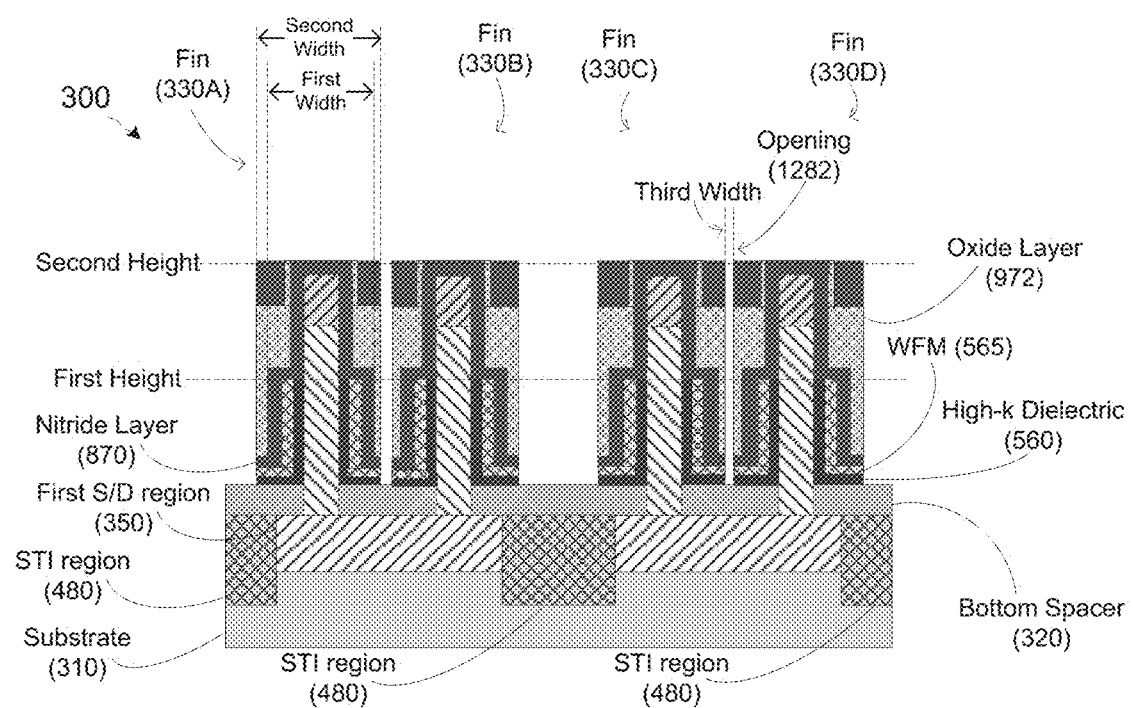
FIG. 21 illustrates a stylized X1-cut cross-sectional depiction of the vFET device under manufacture with respect to WFM layer and high-k dielectric layer removal processes, in accordance with embodiments herein.
Figure 22:
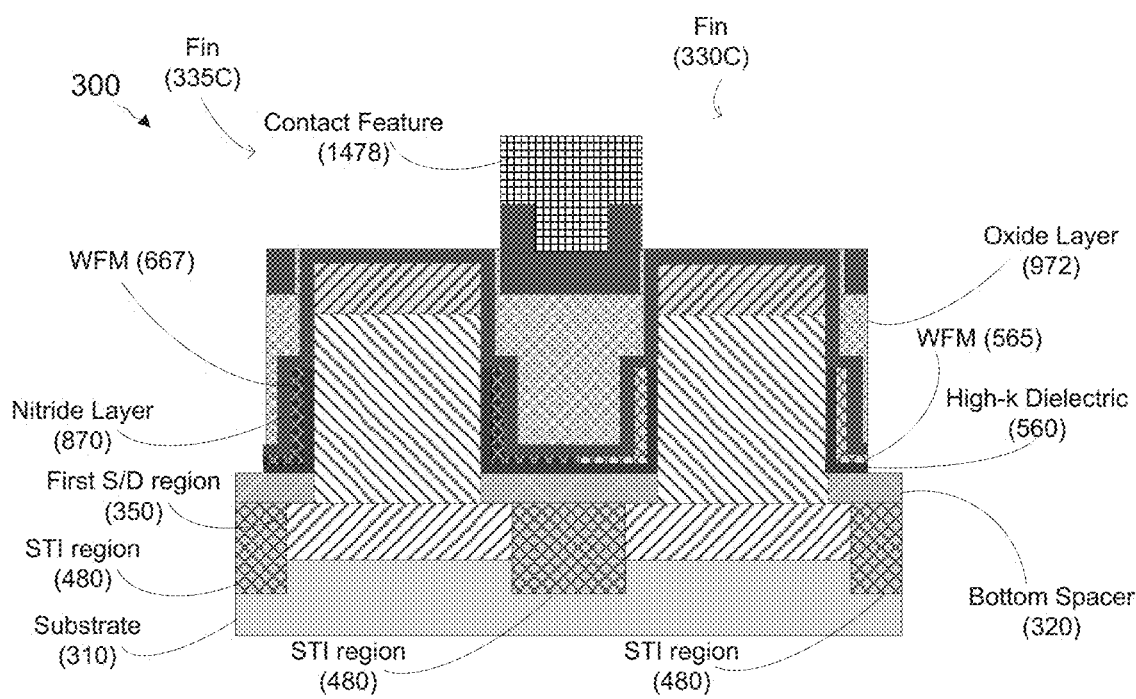
FIG. 22 illustrates a stylized Z-cut cross-sectional depiction of the vFET device under manufacture with respect to the WFM layer and high-k dielectric layer removal processes, in accordance with embodiments herein.

FIG. 21 illustrates a stylized X1-cut cross-sectional depiction of the vFET device under manufacture with respect to WFM layer and high-k dielectric layer removal processes, in accordance with embodiments herein. FIG. 22 illustrates a stylized Z-cut cross-sectional depiction of the vFET device under manufacture with respect to the WFM layer and high-k dielectric layer removal processes, in accordance with embodiments herein. The WFM layer 565 and the high-k dielectric layer 560 are partially removed at the bottom of the opening 1282. The WFM layer 565 and the high-k dielectric layer 560 may be removed by any appropriate technique.

As shown in FIGS. 21-22, surfaces of the WFM layer 565 and the high-k dielectric layer 560 may be exposed to the opening 1282. In one embodiment, a nitride liner (not shown) may be formed on a cross-sectional surface of the high-k dielectric layer 560 and the WFM layer 565 exposed to the opening 1282, i.e., the sides of the high-k dielectric layer 560 and the WFM layer 565 where these layers are disposed on bottom spacer 320 between fins 330A, 330B. Though not to be bound by theory, such a nitride liner may protect the high-k dielectric layer 560 and/or the WFM layer 565 from being damaged during further operations.

Figure 23:
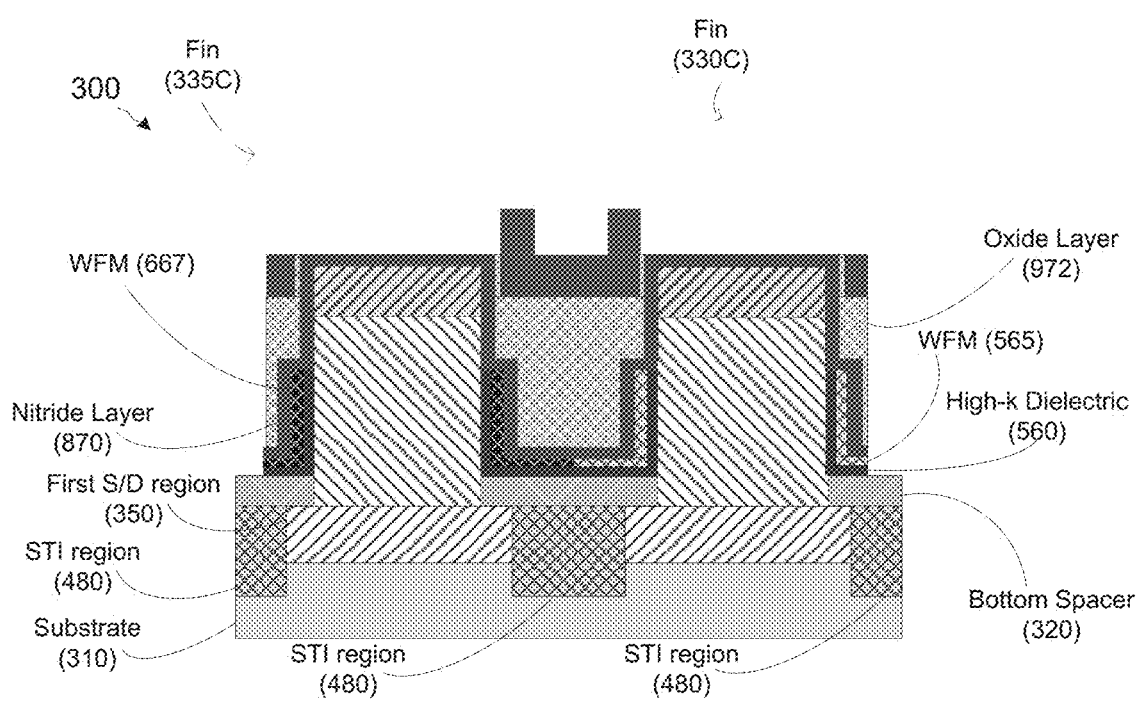
FIG. 23 illustrates a stylized Z-cut cross-sectional depiction of the vFET device under manufacture with respect to a patterning removal processes, in accordance with embodiments herein.

FIG. 23 illustrates a stylized Z-cut cross-sectional depiction of the vFET device under manufacture with respect to a patterning removal processes, in accordance with embodiments herein. The contact feature (FIG. 22, reference numeral 1478) may be removed by any appropriate technique.

Figure 24:
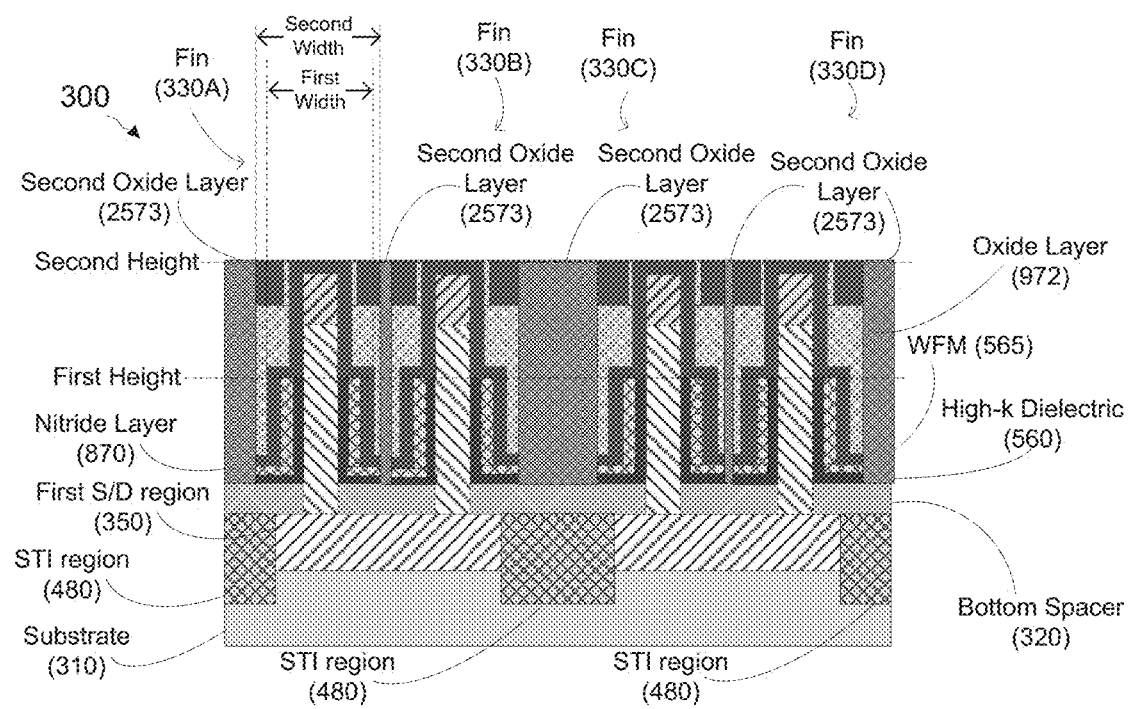
FIG. 24 illustrates a stylized X1-cut cross-sectional depiction of the vFET device under manufacture with respect to oxide deposition and CMP processes, in accordance with embodiments herein.
Figure 25:
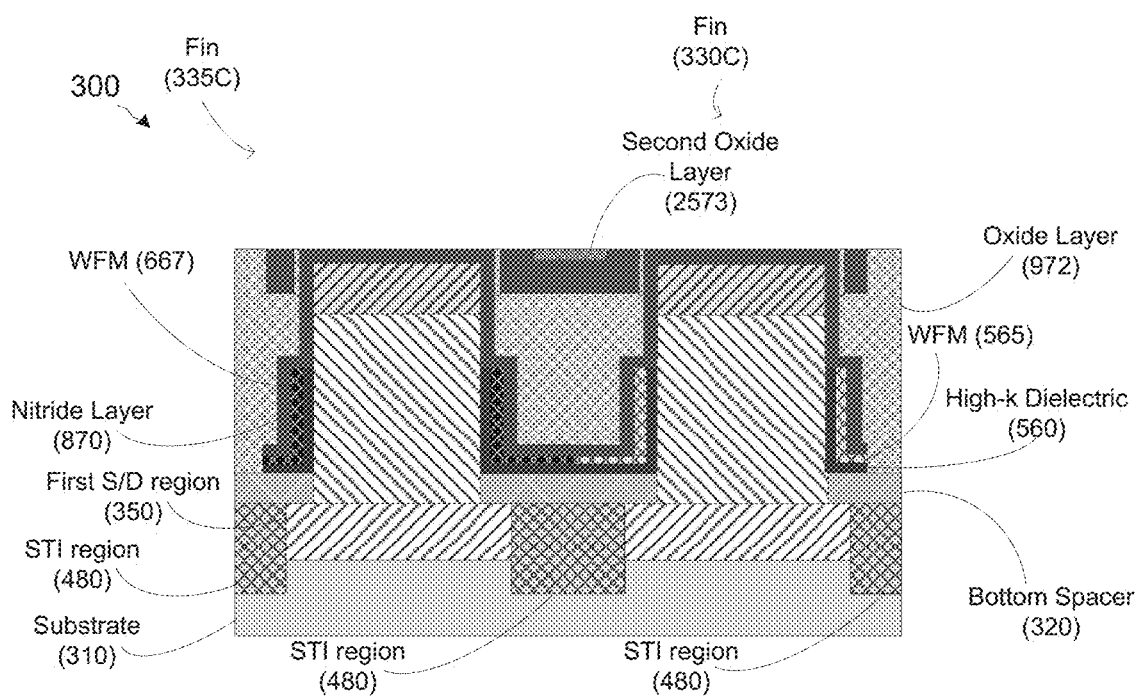
FIG. 25 illustrates a stylized Z-cut cross-sectional depiction of the vFET device under manufacture with respect to the oxide deposition and CMP processes, in accordance with embodiments herein.

FIG. 24 illustrates a stylized X1-cut, and FIG. 25 a stylized Z-cut, cross-sectional depiction of the vFET device under manufacture with respect to oxide deposition and CMP processes, in accordance with embodiments herein. As depicted in FIGS. 24-25, a second oxide layer 2573 may be deposited in openings 1282, in areas between and/or around groups of fins (e.g., between fins 330B and 330C, to the left of fin 330A, and to the right of fin 330D), and in the area where the contact feature (FIG. 22, reference numeral 1478) was removed. A CMP process may be performed to make tops of the second oxide layer 2573 coplanar with the tops of fins 330A-D. Being a dielectric material, the second oxide layer 2573 electrically isolates the WFM layers 565 of adjacent fins 330. The second oxide layer 2573 may be deposited and CMP may be performed according to any appropriate technique.

Figure 26:
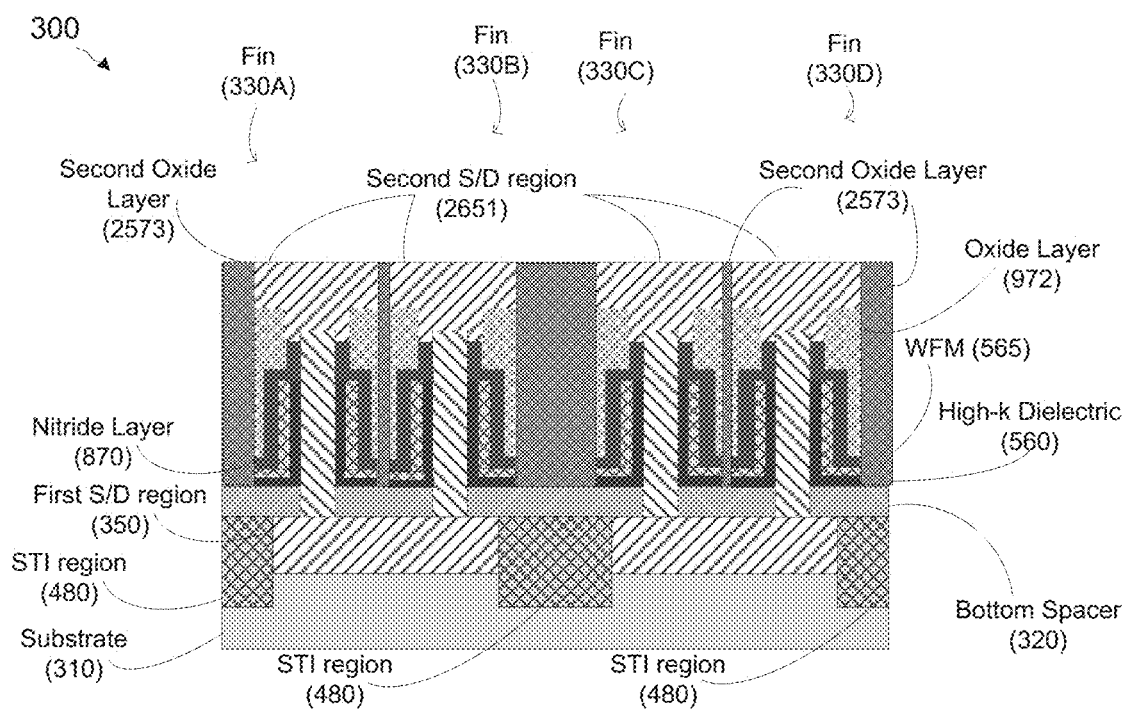
FIG. 26 illustrates a stylized X1-cut cross-sectional depiction of the vFET device under manufacture with respect to formation of a second source/drain region, in accordance with embodiments herein.

Further processes known to those skilled in the art may be performed to complete the processing of the vFET device. For example, further processing steps (e.g., source/drain (S/D) formation, silicide process, back-end-of-line (BEOL) may be performed to form MOSFET devices using FET processes. For example, (not shown) contacts may be formed through oxide layer 972 and/or second oxide layer 2573 to make electrical connections to the first S/D region 350 and/or the WFM layer 565 from features disposed above fins 330, while maintaining electrical isolation of the WFM layers 565 of adjacent fins 330. In one embodiment, as depicted in FIG. 26, the nitride spacer 1286, the oxide liner 1174, and an upper portion of the nitride layer 870 may be removed from the fin structures 330, and a second S/D region 2651 may be formed, such as by epitaxial growth of an appropriate S/D material. The drain and source regions for an NMOS device may be formed from n-doped silicon or low germanium percentage SiGe material. The drain and source regions for a PMOS device may be formed from p-doped germanium or high germanium percentage SiGe material. Accordingly, the processes exemplified herein may be used to provide N-FET and/or P-FET devices using the same base semiconductor structure.

The process exemplified herein may be used to manufacture a vFET device comprising a first source/drain (S/D) region formed on a substrate; a plurality of fin structures formed above the first S/D region, wherein each the fin structure comprises a high-k dielectric layer and a work function metal (WFM) layer on at least a first side and a second side up to a first height, wherein the fin structure has a first width at the first height; and wherein each the fin structure comprises a nitride spacer on at least said first side and said second side at and above a second height, wherein the second height is greater than the first height, and each the fin structure has a second width at the second height, wherein the second width is greater than the first width; a gate region above the first S/D region and adjacent at least a portion of the fin structures; and a second S/D region above the plurality of fin structures. The vFET device may further comprise a contact between a first end of the plurality of fin structures and a second end of a second plurality of fin structures. Alternatively or in addition, the vFET device may further comprise a shallow trench isolation (STI) between two adjacent fin structures of the plurality of fin structures. Further, the vFET device may further comprise a bottom spacer layer disposed on the first S/D region between the fin structures.

Figure 27:
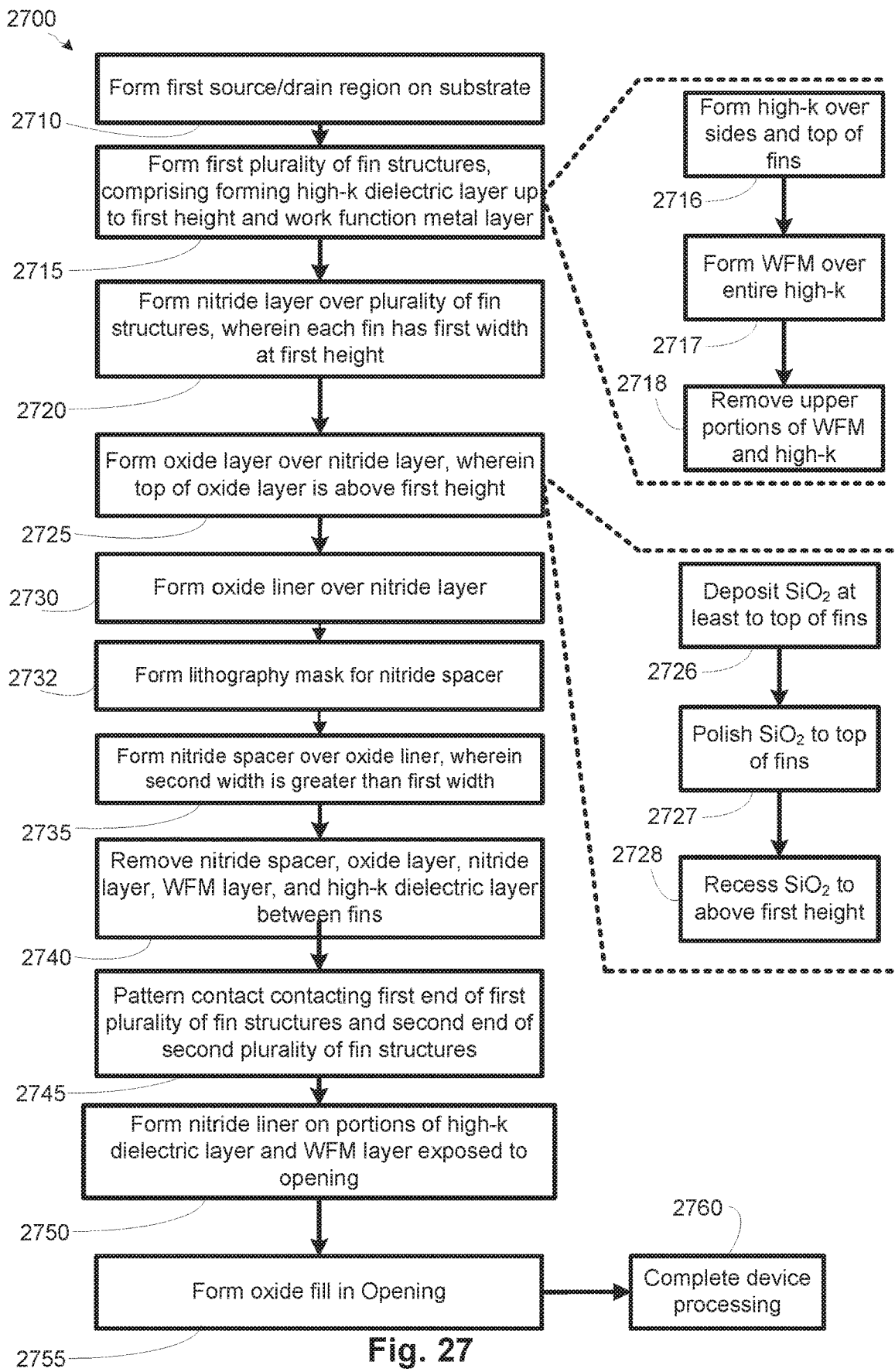
FIG. 27 illustrates a flowchart depiction of process steps of providing a vFET device, in accordance with embodiments herein.

Turning now to FIG. 27, a flowchart depiction of process steps of providing a vFET device in accordance with embodiments herein is illustrated. The process 2700 may comprise forming a first source/drain (S/D) region on a substrate (at 2710), The process may further comprise forming (at 2715) a first plurality of fin structures above the first S/D) region, comprising forming a high-k dielectric layer up to a first height on at least at least a first side and a second side of each fin structure of the first plurality of fin structures, and forming a work function metal (WFM) layer on the high-k dielectric layer. In one embodiment, forming (at 2715) may comprise forming (at 2716) the high-k dielectric layer over the entirety of the first side and the second side and over a top of each fin structure; forming (at 2717) the WFM layer over the entirety of the high-k dielectric layer; and removing (at 2718) an upper portion of the high-k dielectric layer and an upper portion of the WFM layer from the top of each the fin structure and from the first side and the second side of each the fin structure down to the first height.

The process may also comprise forming (at 2720) a nitride layer over the first plurality of fin structures, wherein each the fin structure has a first width at the first height. The nitride liner may comprise silicon nitride. The process may additionally comprise forming (at 2725) an oxide layer over the nitride layer, wherein a top of the oxide layer between the fin structures is above the first height. In one embodiment, the forming (at 2725) may comprise depositing (at 2726) silicon oxide at least to a top of each the fin structure, polishing (at 2727) the silicon oxide to the top of each the fin structure, and recessing (at 2728) the silicon oxide between the fin structures to above the first height.

The process may yet further comprise forming (at 2730) an oxide liner over the nitride layer. The process may yet additionally comprise forming (at 2732) a mask over pluralities of fins on which subsequent process steps are not desired to be performed. The process may comprise forming (at 2735) a nitride spacer over the oxide liner, wherein a top of the nitride spacer between the fin structures is at a second height, wherein the second height is greater than the first height; wherein each the fin structure has a second width at the second height, wherein the second width is greater than the first width; and wherein an opening between adjacent fins has a third width at the second height. The nitride spacer may comprise silicon nitride.

The process may additionally comprise removing (at 2740) the nitride spacer, the oxide layer, the nitride layer, the WFM layer, and the high-k dielectric layer between the fin structures, whereby the opening between the adjacent fin structures has the third width at the first height and the third width at a base of each the fin structure. In embodiments, any of the actions of the process may further involve the formation and processing of a second plurality of fins, wherein the second plurality of fins ma be substantially the same as the first plurality. The first and second pluralities of fins may be disposed such that a first end of the first plurality is disposed in proximity to a second end of the second plurality.

In embodiments, the process may further comprise one or more of the following. First, the process may further comprise patterning (at 2745) at least one contact the first end of the first plurality of fin structures and the second end of the second plurality of fin structures. Second, the process may further comprise forming (at 2750) a nitride liner on portions of the high-k dielectric and the WFM layer exposed to the opening. Third, the process may further comprise forming (at 2755) an oxide fill in the opening. Fourth, the process may comprise completing (at 2760) device processing, e.g., forming a second S/D region above the plurality of fin structures, among other operations that will be known to a person of ordinary skill in the art.

Figure 28:
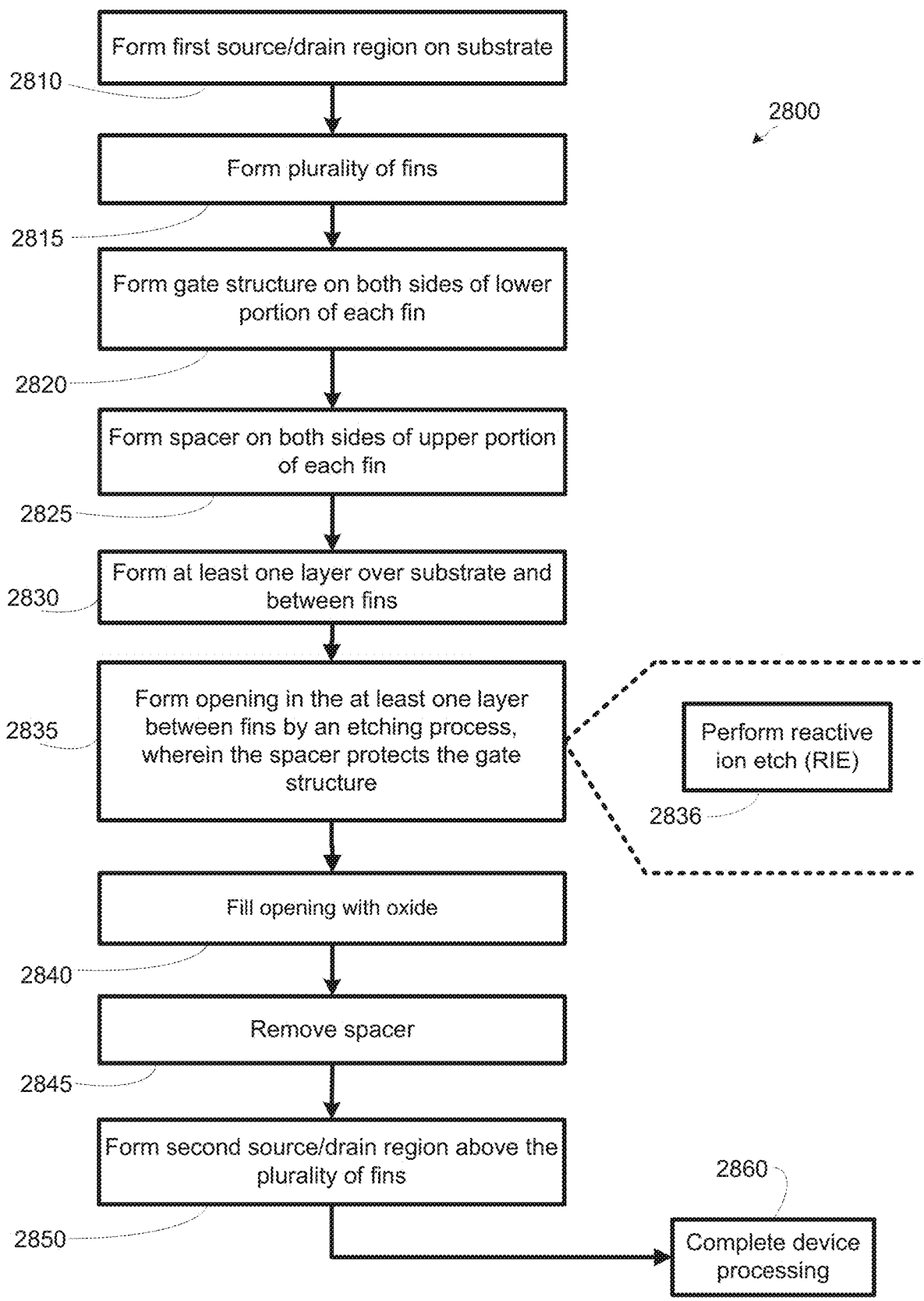
FIG. 28 illustrates a flowchart depiction of process steps of providing a vFET device, in accordance with embodiments herein.

FIG. 28 depicts a flowchart of a process 2800 of providing a vFET device in accordance with embodiments herein. The process may comprise forming (at 2810) a first source/drain (S/D) region on a substrate. The process comprises forming (at 2815) a plurality of vertical fins on the substrate (and above the first S/D region, if present). The process further comprises forming (at 2820) a gate structure on at least a first side and a second side of a lower portion of each vertical fin. The process additionally comprises forming (at 2825) a spacer on at least a first side and a second side of an upper portion of each vertical fin. Also, the process comprises forming (at 2830) at least one layer above the substrate and between the vertical fins. The process yet further comprises forming (at 2835) an opening in the at least one layer between the vertical fins by an etching process, wherein the spacer protects the gate structure during the etching process. The forming an opening (at 2835) may comprise performing (at 2836) a reactive ion etch (RIE).

The process 2800 depicted in FIG. 28 may further comprise one or more of filling (at 2840) the opening with an oxide; removing (at 2845) the spacer from the vertical fins; forming (at 2850) a second source/drain (S/D) region above the plurality of vertical fins; and completing (at 2860) device processing.

Figure 29:
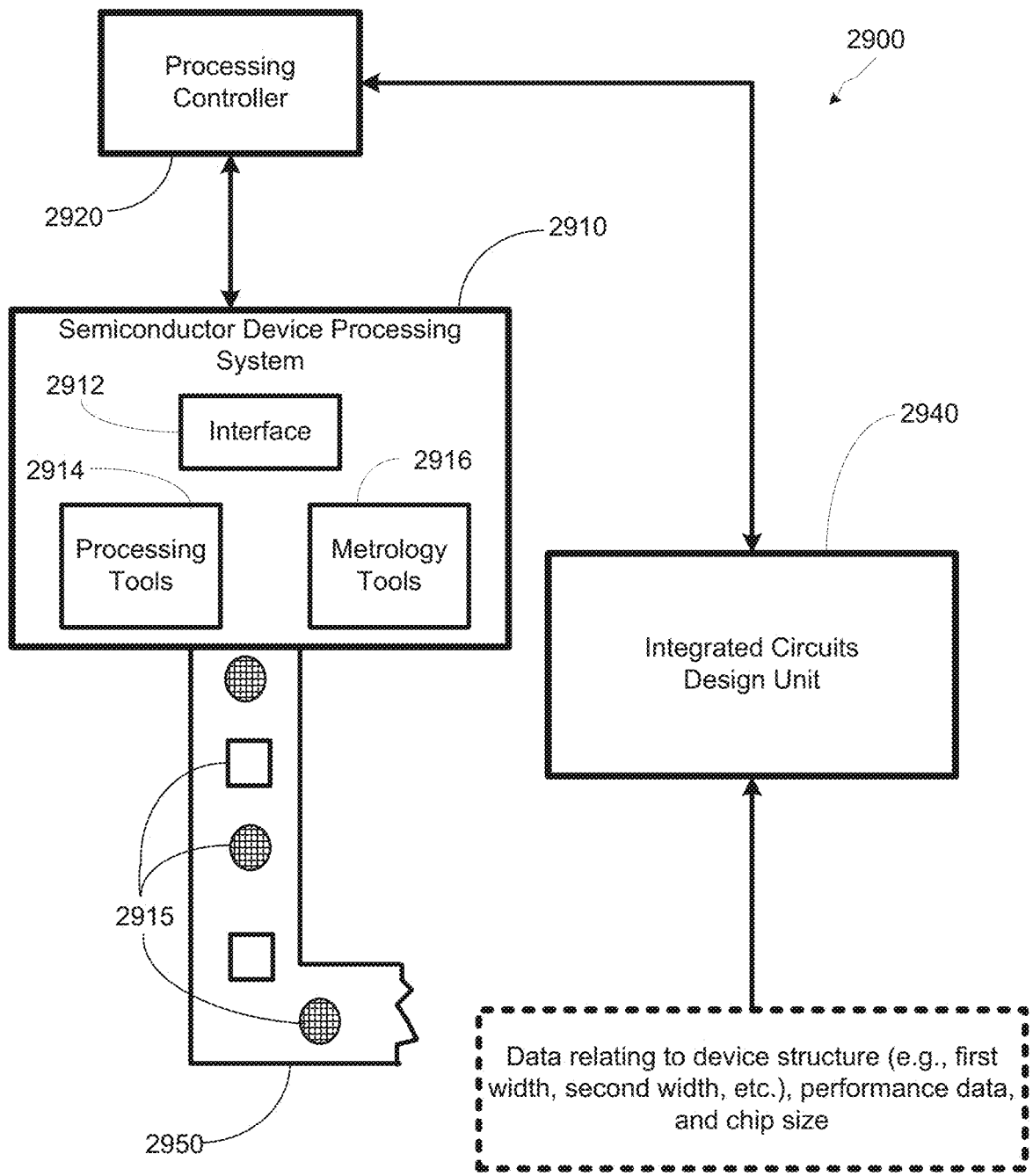
FIG. 29 illustrates a stylized depiction of a system for fabricating a semiconductor device package comprising a vFET device, in accordance with embodiments herein.

Turning now to FIG. 29, a stylized depiction of a system for fabricating a semiconductor device package comprising a vFET, in accordance with embodiments herein, is illustrated. A system 2900 of FIG. 29 may comprise a semiconductor device processing system 2910 and a design unit 2940. The semiconductor device processing system 2910 may manufacture integrated circuit devices based upon one or more designs provided by the design unit 2940. The system 2900 is capable of performing at least one of the process steps described in FIGS. 4-26. The processing system 2910 is capable of implementing the process described in the flowchart of FIG. 27 and/or FIG. 28.

The semiconductor device processing system 2910 may comprise various processing stations, such as etch process stations, photolithography process stations, CMP process stations, etc. Each of the processing stations may comprise one or more processing tools 2914 and or metrology tools 2916. Feedback based on data from the metrology tools 2916 may be used to modify one or more process parameters used by the processing tools 2914 for performing process steps.

The system 2910 may also comprise an interface 2912 that is capable of providing communications between the processing tools 2914, the metrology tools 2916 and a controller, such as the processing controller 2920. One or more of the processing steps performed by the processing system 2910 may be controlled by the processing controller 2920. The processing controller 2920 may be a workstation computer, a desktop computer, a laptop computer, a tablet computer, or any other type of computing device comprising one or more software products that are capable of controlling processes, receiving process feedback, receiving test results data, performing learning cycle adjustments, performing process adjustments, etc.

The semiconductor device processing system 2910 may produce integrated circuits (e.g., vFET devices) on a medium, such as silicon wafers. More particularly, the semiconductor device processing system 2910 may produce integrated circuits having vFET devices wherein the fins have a first width at a first height and a second width at a second height, wherein the second width is greater than the first width.

The production of integrated circuits by the device processing system 2910 may be based upon the circuit designs provided by the integrated circuits design unit 2940. The processing system 2910 may provide processed integrated circuits/devices 2915 on a transport mechanism 2950, such as a conveyor system. In some embodiments, the conveyor system may be sophisticated clean room transport systems that are capable of transporting semiconductor wafers. In one embodiment, the semiconductor device processing system 2910 may comprise a plurality of processing steps, e.g., the 1$^{st}$ process step, the 2$^{nd}$ process step, etc., as described above.

In some embodiments, the items labeled "2915" may represent individual wafers, and in other embodiments, the items 2915 may represent a group of semiconductor wafers, e.g., a "lot" of semiconductor wafers. The integrated circuit or device 2915 may be a transistor, a capacitor, a resistor, a memory cell, a processor, and/or the like. In one embodiment, the device 2915 is a transistor and the dielectric layer is a gate insulation layer for the transistor.

The integrated circuit design unit 2940 of the system 2900 is capable of providing a circuit design that may be manufactured by the semiconductor processing system 2910. This may include information regarding the first height, second height, first width, and second width for vFET devices described above. The integrated circuit design unit 2940 may be capable of determining the number of devices (e.g., processors, memory devices, etc.) to place in a device package. The integrated circuit design unit 2940 may also determine the height of the fins, the dimensions of the S/D regions, the dimensions of the bottom spacer, etc. These dimensions may be based upon data relating to drive currents/performance metrics, device dimensions, etc. Based upon such details of the devices, the integrated circuit design unit 2940 may determine specifications of the vFETs that are to be manufactured. Based upon these specifications, the integrated circuit design unit 2940 may provide data for manufacturing a semiconductor device package described herein. Although, the process steps set forth above are generally described in the context of vFETs, those skilled in the art would appreciate that the process steps may also be performed on standard FET devices.

The system 2900 may be capable of performing analysis and manufacturing of various products involving various technologies. For example, the system 2900 may receive design and production data for manufacturing devices of CMOS technology, Flash technology, BiCMOS technology, power devices, memory devices (e.g., DRAM devices), NAND memory devices, and/or various other semiconductor technologies. This data may be used by the system 2900 to fabricate the devices 300 described herein.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method, comprising:
    forming a plurality of fins on a substrate, wherein each fin comprises a first side, a second side, and a hard mask on a top of the fin, wherein the hard mask has a top surface;
    forming a bottom spacer on the substrate and between each pair of adjacent fins, wherein the bottom spacer is in contact with the first side and the second side of each fin;
    forming a gate structure in contact with the first side of each fin from a first height below the top surface of the hard mask to the bottom spacer and in contact with the second side of each fin from the first height to the bottom spacer, wherein said gate structure comprises a high-k dielectric layer in contact with said fin, a work function metal (WFM) layer in contact with said high-k dielectric layer, and a nitride layer in contact with said WFM layer;
    forming a side spacer in contact with the first side of each fin from the top surface of the hard mask to the first height and in contact with the second side of each fin from the top surface to the first height;
    forming at least one layer above said bottom spacer and between said fins; and
    forming an opening in said at least one layer between said fins by an etching process, wherein said side spacer protects said gate structure from said etching process.

2. The method of claim 1, wherein said substrate comprises silicon or silicon germanium and said at least one layer above said bottom spacer comprises an oxide layer.

3. The method of claim 1, wherein said side spacer comprises a nitride layer in contact with said fin or said hard mask on said fin, an oxide liner in contact with said nitride layer, and a nitride spacer in contact with said oxide liner.

4. The method of claim 1, wherein said side spacer has a first width, said gate structure has a second width, and said first width is greater than said second width.

5. The method of claim 1, wherein said forming an opening comprises performing a reactive ion etch (ME) in forming the opening.

6. The method of claim 1, wherein said plurality of fins is a first plurality of fins and has a first end, and the method further comprises:
    forming a second plurality of fins, wherein said second plurality of fins has a second end proximate said first end; and
    patterning at least one contact contacting both said first end and said second end.

7. The method of claim 1, further comprising electrically isolating said gate structure of a first fin from said gate structure of a second fin by filling said opening with an oxide.

8. The method of claim 7, further comprising:
    removing said side spacer from each fin; and
    forming a second source/drain (S/D) region above said plurality of fins.

9. The method of claim 1, further comprising forming a first source/drain (S/D) region on said substrate, wherein said plurality of fins are formed above said first S/D region.

10. A system, comprising:
    a semiconductor device processing system to manufacture a semiconductor device comprising at least one field effect transistor (FET); and
    a processing controller operatively coupled to said semiconductor device processing system, said processing controller configured to control an operation of said semiconductor device processing system;
    wherein said semiconductor device processing system is adapted to:

form a plurality of fins on a substrate, wherein each fin comprises a first side, a second side, and a hard mask on a top of the fin, wherein the hard mask has a top surface;

form a bottom spacer on the substrate and between each pair of adjacent fins, wherein the bottom spacer is in contact with the first side and the second side of each fin;

form a gate structure in contact with the first side of each fin from a first height below the top surface of the hard mask to the bottom spacer and in contact with the second side of each fin from the first height to the bottom spacer, wherein said gate structure comprises a high-k dielectric layer in contact with said fin, a work function metal (WFM) layer in contact with said high-k dielectric layer, and a nitride layer in contact with said WFM layer;

form a side spacer in contact with the first side of each fin from the top surface of the hard mask to the first height and in contact with the second side of each fin from the top surface to the first height;

form at least one layer above said bottom spacer and between said fins; and form an opening in said at least one layer between said fins by an etching process, wherein said side spacer protects said gate structure from said etching process.

11. The system of claim 10, further comprising:
a design unit configured to generate a design comprising a definition for a plurality of processes and a definition for an operation of a FET device that comprises a plurality of fins, wherein data from said design unit is used by said process controller to control an operation of said semiconductor device processing system.

12. The system of claim 10, wherein said semiconductor device processing system is further adapted to:
form a first source/drain (S/D) region on a substrate, wherein said plurality of fins is formed above said first S/D region.

13. The system of claim 12, wherein said semiconductor device processing system is further adapted to:
remove said side spacer from each fin; and
form a second source/drain (S/D) region above said plurality of fins.

* * * * *